(12) United States Patent
Kawachi

(10) Patent No.: US 8,779,516 B2
(45) Date of Patent: Jul. 15, 2014

(54) SEMICONDUCTOR DEVICE

(75) Inventor: Toshikatsu Kawachi, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 221 days.

(21) Appl. No.: 13/137,146

(22) Filed: Jul. 22, 2011

(65) Prior Publication Data

US 2012/0038003 A1 Feb. 16, 2012

(30) Foreign Application Priority Data

Aug. 13, 2010 (JP) ................. 2010-181234

(51) Int. Cl.
*H01L 23/62* (2006.01)

(52) U.S. Cl.
USPC ........... 257/355; 257/356; 257/357; 257/360; 257/E27.06; 257/E27.016; 438/133; 438/135; 438/139; 438/140; 438/151; 438/197; 438/275; 438/279; 438/283

(58) Field of Classification Search
USPC ........... 257/355–357, 360, E27.06, E27.016; 438/133, 135, 139, 140, 151, 197, 275, 438/279, 283

See application file for complete search history.

(56) References Cited

U.S. PATENT DOCUMENTS 6,469,354 B1 10/2002 Hirata
7,183,612 B2 2/2007 Okushima

FOREIGN PATENT DOCUMENTS

| JP | 11-274404 A | 10/1999 |
|---|---|---|
| JP | 2005-183661 A | 7/2005 |
| JP | 2009-71173 A | 4/2009 |

*Primary Examiner* — Meiya Li
(74) *Attorney, Agent, or Firm* — McGinn IP Law Group, PLLC

(57) ABSTRACT

A second conduction-type MIS transistor in which a source is coupled to a second power source over the surface of a first conduction-type well and a drain is coupled to the open-drain signal terminal is provided. A second conduction-type first region is provided at both sides of the MIS transistor in parallel with a direction where the electric current of the MIS transistor flows and coupled to the open-drain signal terminal. The whole these components are surrounded by a first conduction-type guard ring coupled to the second power source and the outside surrounded by the first conduction-type guard ring is further surrounded by a second conduction-type guard ring coupled to a first power source. Thereby, the semiconductor device is capable of achieving ESD protection of an open-drain signal terminal having a small area and not providing a protection element between power source terminals.

10 Claims, 21 Drawing Sheets

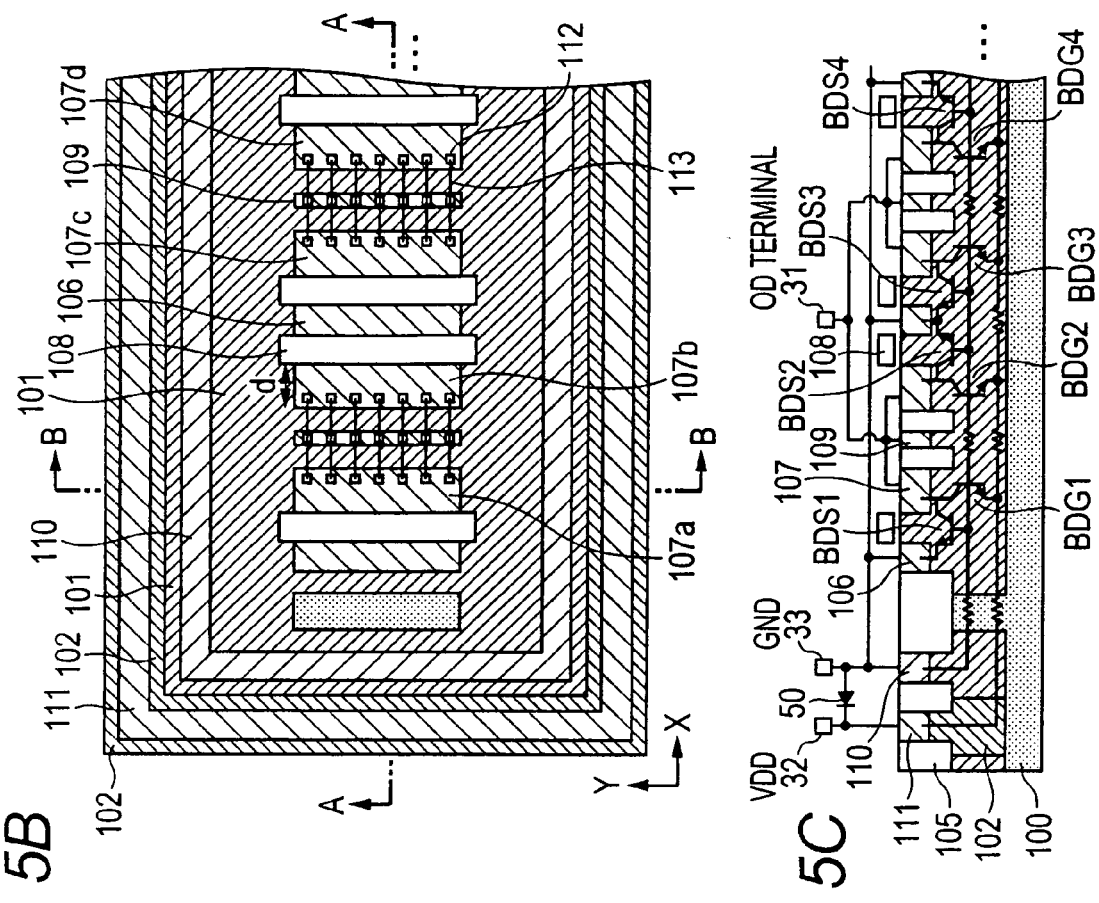
FIG. 5B
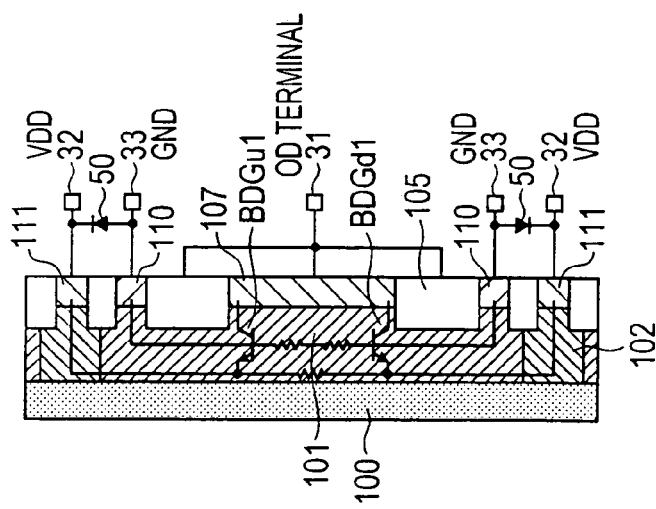
FIG. 5A
FIG. 5C

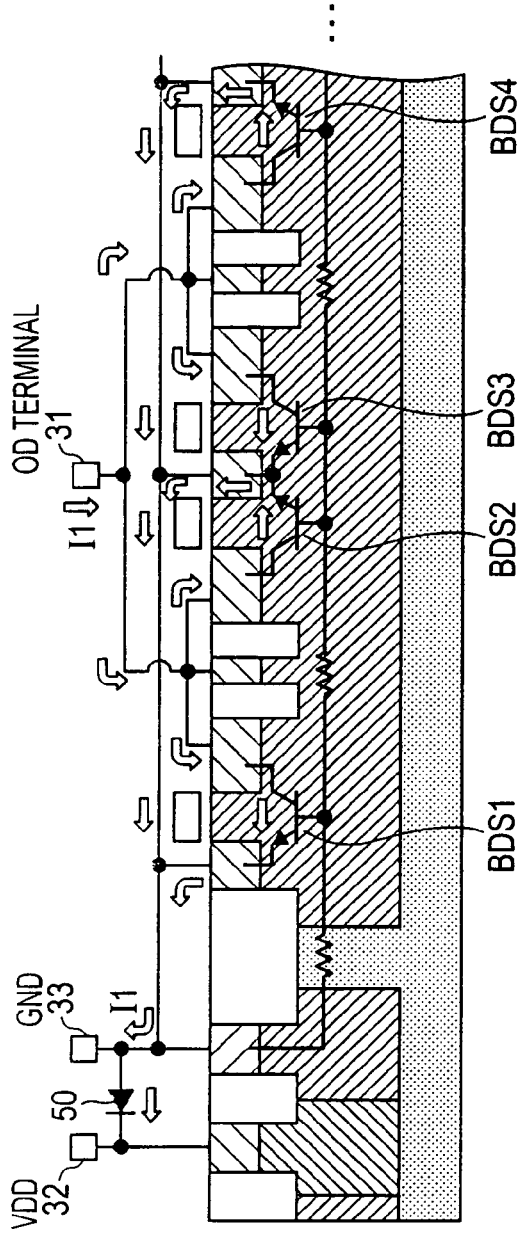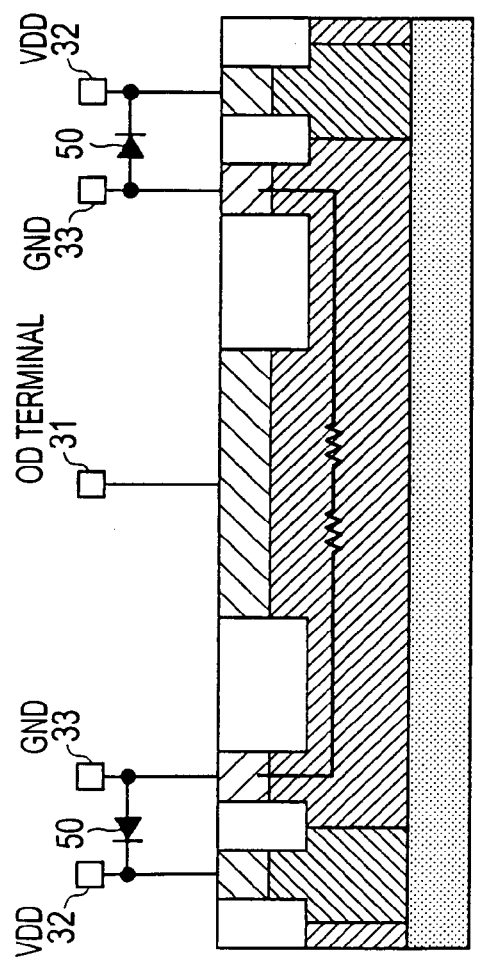
FIG. 6A
FIG. 6B

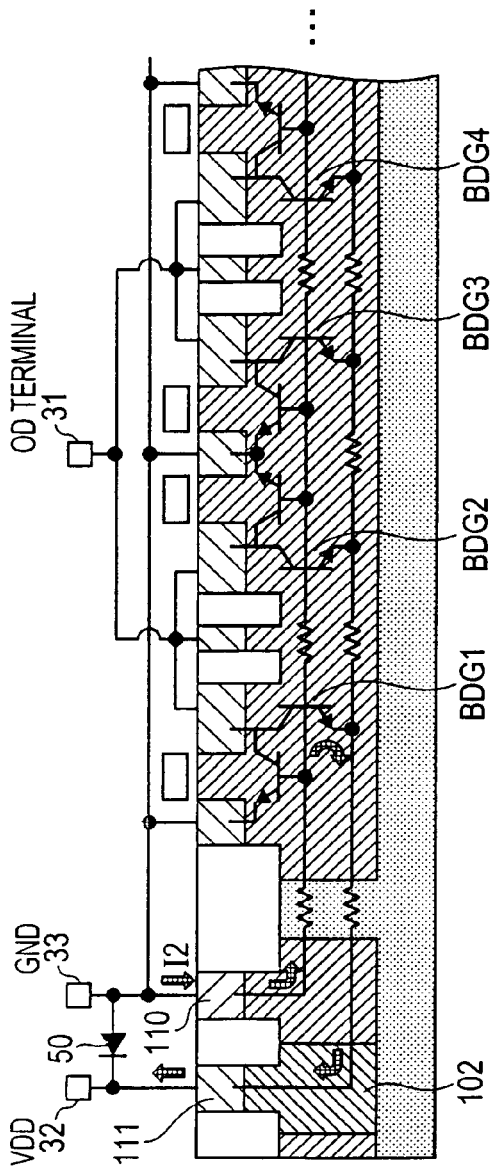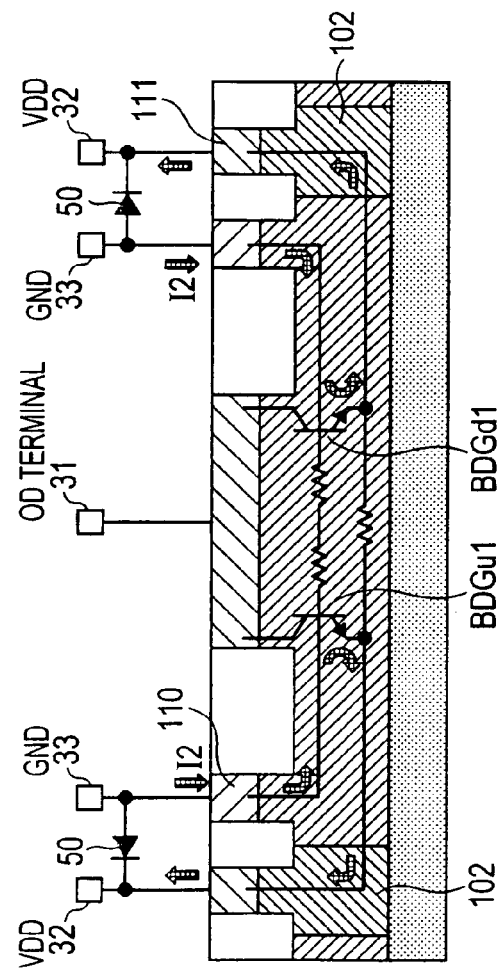
FIG. 7A
FIG. 7B

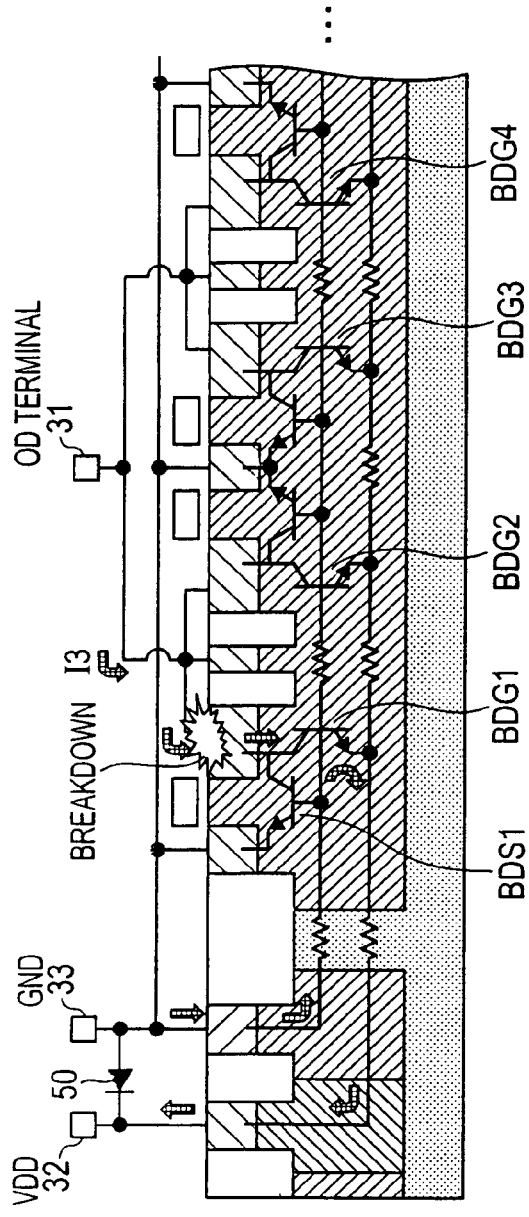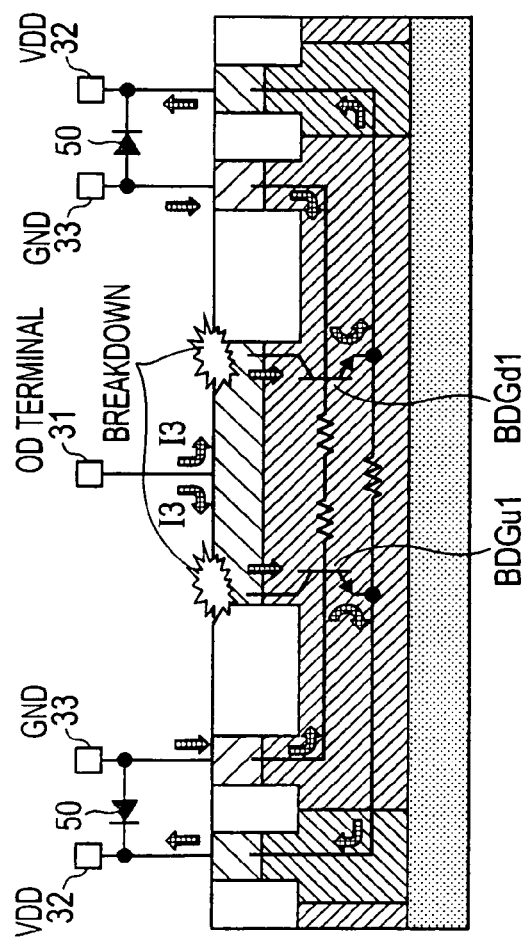
FIG. 8A
FIG. 8B

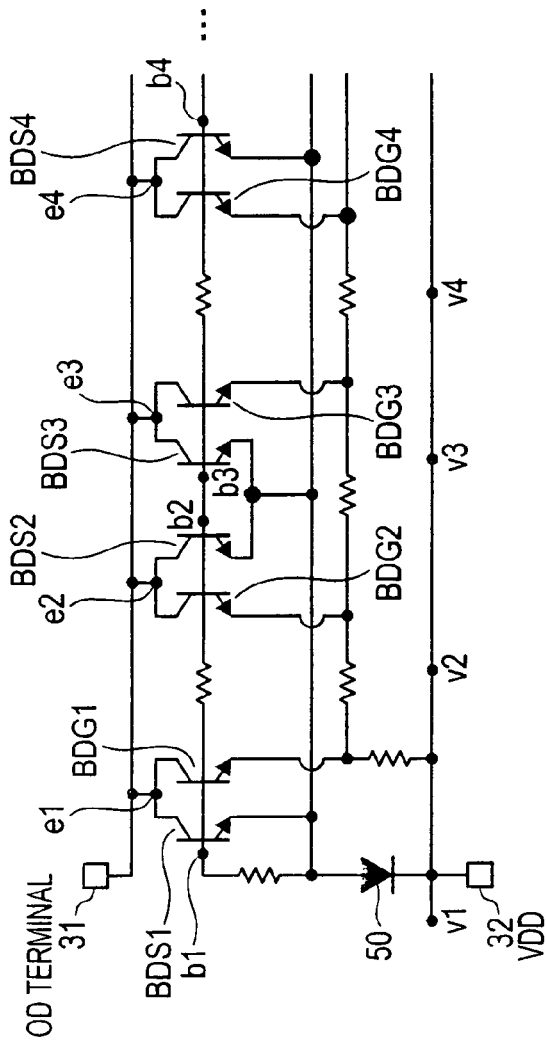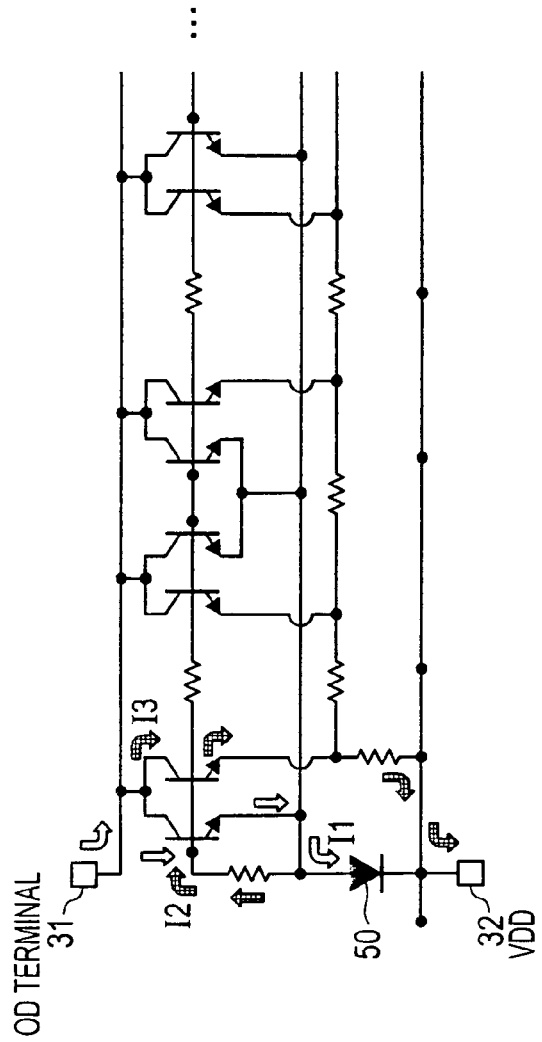
FIG. 9A
FIG. 9B

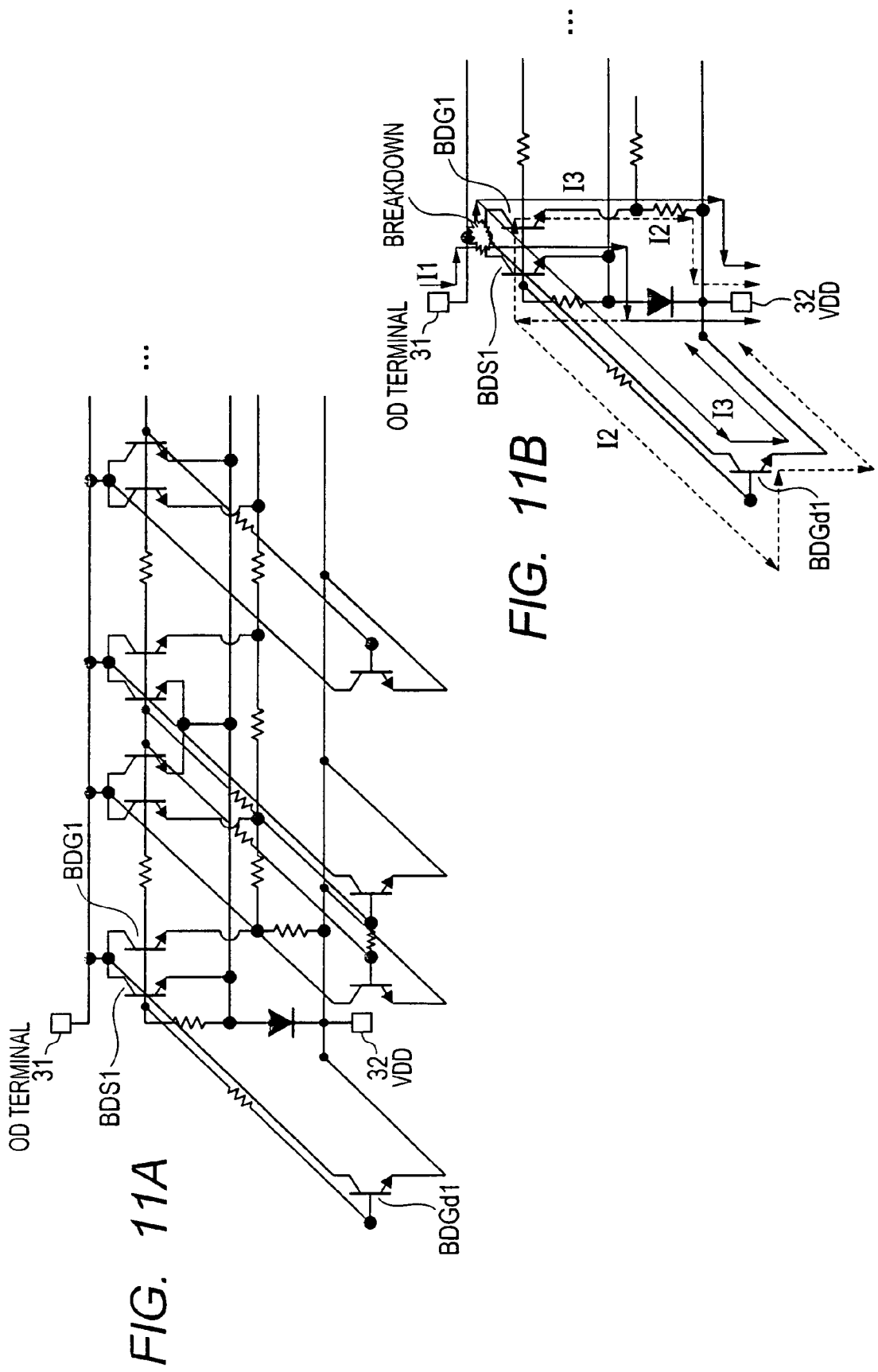

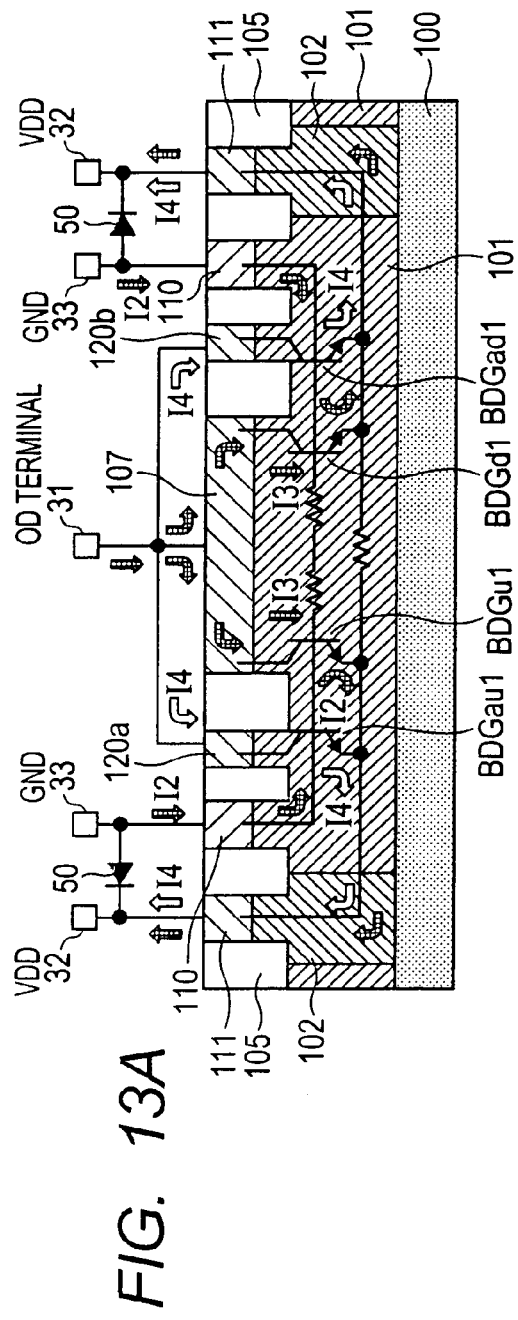

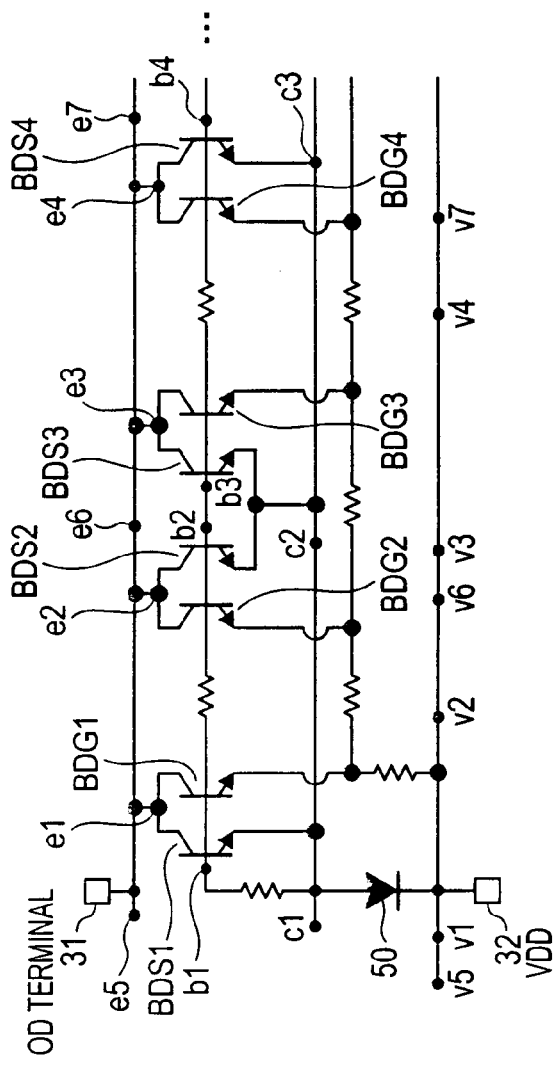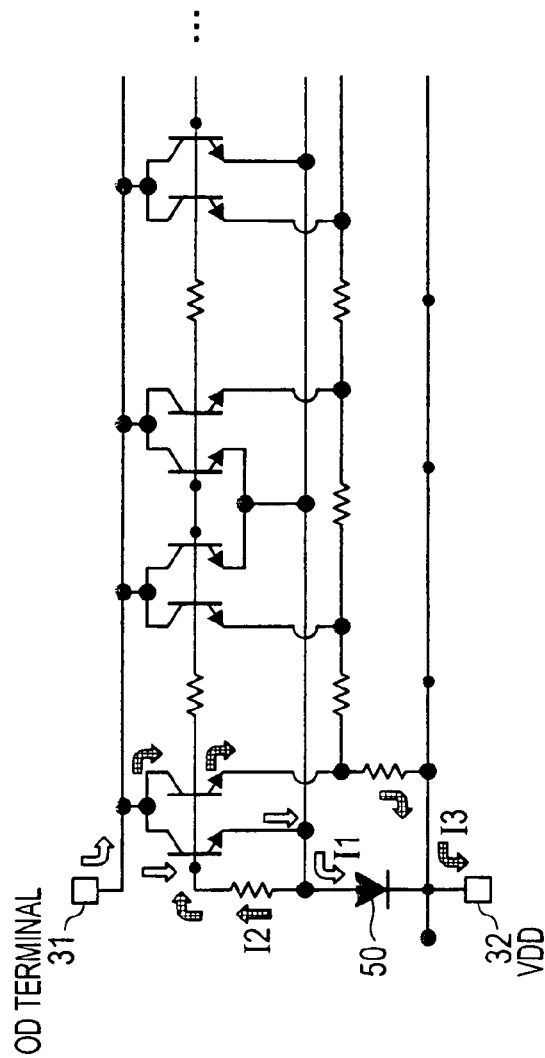
FIG. 14A
FIG. 14B

SEMICONDUCTOR DEVICE

CROSS-REFERENCE TO RELATED APPLICATIONS

The disclosure of Japanese Patent Application No. 2010-181234 filed on Aug. 13, 2010 including the specification, drawings and abstract is incorporated herein by reference in its entirety.

BACKGROUND

The present invention relates to a semiconductor device. In particular, the present invention relates to a semiconductor device providing an electro static discharge (ESD) protection element of an open-drain signal terminal in a semiconductor device having the open-drain signal terminal.

In semiconductor devices, the open-drain signal terminal is used for an output terminal, an input terminal or an input/output terminal (hereinafter referred to as a signal terminal) which is expected to apply voltage higher than power source voltage. For a common signal terminal which is not an open-drain type (any one of the output terminal, the input terminal or the input/output terminal), for example, as shown in FIG. 11 of Japanese Unexamined Patent Application Publication No. Hei 11 (1999)-274404, it is common that the ESD protection element (a protection diode and the like) of the signal terminals are provided both of between a power source terminal VDD at a higher voltage side and the signal terminal and between a power source terminal GND in lower voltage side and the signal terminal. However, in the open-drain signal terminal, voltage higher than the voltage of the power source terminal VDD (in the case of an N-channel open drain) is applied or voltage lower than the voltage of the power source terminal GND (in the case of a P-channel open drain) is applied to the signal terminal in a common use state. Therefore, in the case of the N-channel open drain, it is difficult to provide the ESD protection element such as a diode between the signal terminal and the power source VDD at the higher voltage side. Similarly, in the case of the P-channel open drain, it is difficult to provide the ESD protection element between the signal terminal and the power source GND at the lower voltage side. Consequently, an ESD protection of the ESD signal terminal of the open-drain signal terminal needs ESD protection measures different from those for a common signal terminal.

Particularly, in order to reduce power consumption of a semiconductor device when operation of a part of function blocks in all functions is not required depending on operating state of the semiconductor device, control for reducing power consumption has been performed by stopping supply of power source to the function blocks these days. This is because leak current of MOS transistors with forming shorter channel can not be ignored. In this case, supply of power source stops and the power source voltage VDD at the higher voltage side lowers to the power source voltage GND at the lower voltage side. As a result, signal voltage higher than the power source voltage VDD is applied to the signal terminal of the function block. Consequently, the signal terminal is required to employ an N-channel open-drain structure. The ESD protection element which is used between a common signal terminal and the power source terminal VDD cannot be provided between the signal terminal and the power source terminal VDD.

An ESD protection circuit of the open-drain signal terminal used in related arts is shown in FIG. 1. In FIG. 1, 31 is the open-drain signal terminal, 32 being the VDD terminal which is a power source terminal at the higher voltage side, 33 being the GND terminal which is a power source terminal at the lower voltage side, 40 being an input gate, and 34 being an open-drain signal terminal protection element provided between the open-drain signal terminal 31 and the GND terminal 33. The open-drain signal terminal 31 of FIG. 1 is a signal input terminal and provides the input gate 40 which takes a logic level of the open-drain signal terminal 31 into the semiconductor device. The input gate 40 is a CMOS inverter-type input gate including a P-type MOS transistor 41 and an N-type MOS transistor 42.

N-type MOS transistor structure is used in the open-drain signal terminal protection element 34 as a protection element. Since the open-drain signal terminal 31 in FIG. 1 is an input terminal, a gate of the N-type MOS transistor which forms the open-drain signal terminal protection element 34 is fixed at the lower voltage (GND). This open-drain signal terminal protection element 34 functions as a parasitic bipolar transistor (an NPN-type bipolar transistor) when high voltage ESD is applied to the open-drain signal terminal 31 between the open-drain signal terminal 31 and the GND terminal 33, and functions as a protection element by discharging positive charge applied to the open-drain signal terminal 31 to the GND terminal 33.

When the open-drain signal terminal 31 is used as an output terminal, the open-drain signal terminal 31 can function as the output terminal, if conduction or non-conduction of the gate of the N-type MOS transistor forming the open-drain signal terminal protection element 34 is controlled by control signals. When the open-drain signal terminal 31 is only used as an output terminal and is not used as an input terminal, the input gate 40 can be omitted.

When high voltage as ESD is applied to the open-drain signal terminal 31 between the open-drain signal terminal 31 and the VDD terminal 32, a route through which electric current flows to the VDD terminal 32 is shown in FIG. 2. As shown in FIG. 2, a protection element is not directly provided between the open-drain signal terminal 31 and the VDD terminal 32. As a result, charge applied to the open-drain signal terminal 31 is firstly discharged to the GND terminal 33 through the open-drain signal terminal protection element 34 provided between the open-drain signal terminal 31 and the GND terminal 33. Then, the charge is discharged to the VDD terminal 32 through a protection element between the power source terminals 50 provided between the GND terminal 33 and the VDD terminal 32.

Subsequently, although not limited to open-drain signal terminals, a semiconductor device providing an ESD protection structure which can widely be applied is described in Japanese Unexamined Patent Application Publication No. Hei 11 (1999)-274404, including a protection for the open-drain signal terminal. FIG. 3A is a plan view showing the ESD protection structure of the semiconductor device, and FIG. 3B is a cross-sectional view taken from line A-A of FIG. 3A. The structure is described with reference to FIGS. 3A and 3B. Over the surface of a P well 101 provided over the surface of a P-type semiconductor substrate 100, a source region 106a, sources and drains of a drain region 107a, a source region 106b, a drain region 107b, and a source region 106c of an N-type MOS transistor are alternatively located along an X direction. Each contact 112 for external connection is provided for each of the source regions 106a to 106c and the drain regions 170a, 170b. Gate electrodes 108 are located sandwiching gate oxide films over the surface of the P-type semiconductor substrate 100 between each of the drain regions 170a, 170b and the source regions 106a to 106c. A P-type guard ring region 110 is provided over the surface of the P well 101 with surrounding all of the source regions 106a to 106c and the drain regions 170a, 170b. A low concentration P-type substrate regions 104 which has lower concentration than the concentration of the P well 101 is provided between the source regions 106a to 106c which are located at both end in the X direction (a direction in which electric current flows to a channel) where all of the source regions 106a to 106c and the drain regions 170a, 170b are alternatively located and the P-type guard ring region 110. An element separation region (an insulating layer) 105 is provided over the surface of a region where an MOS transistor is not provided.

Wirings which are not shown in the view are coupled to the contact 112 provided for each of the source regions 106a to 106c and each of the drain regions 170a, 170b. Interconnections are formed between the sources and between the drains. The N-type source regions 106a to 106c and the P-type guard ring region 110 are coupled to the low voltage power source terminal GND with wirings which are not shown in the view. The drain regions 107, 107b are coupled to a signal terminal with wirings which are not shown in the view. When the N-type MOS transistor is conducted, electric current flows from each of the drain regions 107a, 107b to the source regions 106a to 106c which are adjacently located in the X direction at both sides of the drain regions.

Subsequently, operation when the semiconductor device of FIGS. 3A and 3B which functions as a protection element to the ESD is described. A parasitic bipolar transistor (an NPN-type transistor) formed by the N-type drain regions 107a and 107b as collectors, the P well 101 as a base and the N-type source regions 106a to 106c as emitters is formed between the drain regions 107a, 107b and the source regions 106a to 106c. At the time of common use, both of the P well 101 and the source regions 106a to 106c are coupled to the low voltage power source GND. This parasitic bipolar transistor is not conducted because the P well 101 and the source regions 106a to 106c have the same electric potential. However, when the ESD having higher voltage than the voltage of the low voltage power source terminal GND is applied to the signal terminal, a PN junction between the N-type drain region 107 coupled to the signal terminal and the P well 101 coupled to the low voltage power source GND breaks down. As a result, a certain level of electric current flows between the drain region 107 and the P-type guard ring region 110. When the electric current starts to flow between the drain region 107 and the P-type guard ring region 110, voltage of P well adjacent to the source region 106 increases by resistance of the P well 101. When increase in the electric potential of the P well exceeds 0.6 to 0.7 V which is a threshold value VBE of the parasitic bipolar transistor, the parasitic bipolar transistor starts to conduct and discharge from the drain region 107 to the source region 106 are performed.

When the low concentration P-type substrate region 104 is not provided, P well resistance of the source region 106b located away from the P-type guard ring region 110 is higher than P well resistance of the source regions 106a and 106c located near the P-type guard ring region 110 in P well resistances from the P-type guard ring region 110 to each of the source regions 106a to 106c. Therefore, increase in the source region 106b located away from the P-type guard ring region 110 is higher than the increase in the source regions 106a and 106c located near the P-type guard ring region 110 for voltage elevation of the P well at the time of breakdown of the PN junction diode structure between the drain regions 107a and 107b and the P well 101. At the time of ESD application, a parasitic bipolar transistor formed by an MOS transistor in which a base region is located away from the P-type guard ring region 110 is easy to conduct compared to a parasitic bipolar transistor in which the base region is located near the P-type guard ring region 110. Consequently, the parasitic bipolar transistor in which the base region is located near the P-type guard ring region 110 may not function well as a protection element.

In Japanese Unexamined Patent Application Publication No. Hei 11 (1999)-274404, even a parasitic bipolar transistor located near the P-type guard ring region 110 sufficiently functions as a protection element in such a way that each MOS transistor provided as the protection element by increasing P well resistance at the time of ESD application is almost simultaneously triggered as the parasitic bipolar transistor. This is achieved by providing the low concentration P-type substrate region 104 between the MOS transistor located near the P-type guard ring region 110 and the P-type guard ring region 110.

In an ESD protection structure in which multiple protection elements are provided in parallel, it is known that a structure in which each ballast resistance is provided in series between each protection element and terminal so as to simultaneously operate each protection element in parallel as the protection elements without concentrating electric current only in a part of the protection elements and each protection element simultaneously operates in parallel is effective. FIG. 4 is a perspective view showing a part of a structure of a semiconductor device which provides an improved ballast resistance structure described in Japanese Unexamined Patent Application Publication No. 2005-183661. In FIG. 4, a P well 26 is provided over the surface of a silicon substrate 2 and a source region 6 and a drain region 14 of an N-type MOS transistor 23 are provided over the surface of the P well 26. The drain region 14 is coupled to an $N^+$-type diffusion region 15 through a contact 18, a metal wiring 20 and a contact 19. Another contact 21 is further provided over the $N^+$-type diffusion region 15 and coupled to a metal wiring 22. The metal wiring 22 is coupled to a pad which is not shown in the view. The drain region 14 and the $N^+$-type diffusion region 15 are insulated by a STI region 5. The drain region 14, the $N^+$-type diffusion region 15 and the STI region 5 form a ballast resistance region 7 as a whole. In Japanese Unexamined Patent Application Publication No. 2005-183661, by this ballast resistance region 7, the ballast resistance having sufficient resistance value is realized in small increase in area by coupling to the pad from the drain region 14 through the contact 18, the metal wiring 20, the contact 19, the $N^+$-type diffusion region 15, the contact 21 and the metal wiring 22.

In Japanese Unexamined Patent Application Publication No. 2009-71173, a semiconductor device providing an ESD protection element which complements a protection diode formed by a drain of an MOS transistor and a P-type guard ring and intends to obtain sufficient discharge capacity is described. This semiconductor device is prepared by providing an N-type cathode region, which is located over the surface of the P well existing inside of the P-type guard ring region surrounding the N-type MOS transistor provided over the P well, and is coupled to a signal terminal more adjacent to the P-type guard ring than the drain of the N-type MOS transistor coupled to the signal terminal.

SUMMARY

The following analysis is given by the present invention. ESD whose voltage exceeds a power source voltage (when the power source is a positive power source, higher or equal voltage than the voltage of the positive power source, and when the power source is a negative power source, lower or equal voltage than the voltage of the negative power source)

is applied to an open-drain signal terminal 31 between the open-drain signal terminal (refer to 31 in FIG. 5C) and a power source without providing a direct protection element between the open-drain signal terminal (refer to a VDD terminal 32 in FIG. 5C). In this case, a parasitic vertical-type bipolar transistor (refer to BDG1, BDG2, BDG3, BDG4, BDGu1 and BDGd1 in FIGS. 5A and 5C and an electric current route I3 in FIG. 8) which is formed between a drain region 107 and the same conduction-type guard ring region (an N-type guard ring region 111) is operable other than the original parasitic horizontal-type bipolar transistor (refer to BSD1, BSD2, BSD3 and BSD4 in FIG. 5A and an electric current route I1 in FIG. 6A) between the drain region and the source region. Particularly, when the parasitic bipolar transistor once starts operation as a bipolar transistor, a drain diffusion layer is broken down because electric current concentratedly flows to the parasitic bipolar transistors (BDG1, BDGu1 and BDGd1) having narrow base region in a. This problem is described in detail in the description of embodiments.

A semiconductor device according to one aspect of the present invention includes a first and a second power source terminals; an open-drain signal terminal; a first conduction-type well provided over the surface of an semiconductor substrate; a second conduction-type MIS transistor in which a source region provided over the surface of the first conduction-type well is coupled to the second power source terminal and a drain region is coupled to the open-drain signal terminal; a pair of second conduction-type first regions provided at both sides in parallel with a first direction where electric current of the second conduction-type MIS transistor flows over the surface of the first conduction-type well, and located in a second direction which intersects at right angles to the first direction of the second conduction-type MIS and each of the second conduction-type first region is coupled to the open-drain signal terminal; a first conduction-type guard ring region provided over the surface in an outer circumferential part of the first conduction-type well surrounding the second conduction-type MIS transistor and the pair of second conduction-type first regions and coupled to the second power source terminal, in which the first conduction-type guard ring region has higher concentration than the first conduction-type well; a second first conduction-type guard ring provided over the surface of the semiconductor substrate further surrounding the first conduction-type guard ring from the outside and coupled to the first power source terminal; and a protection element between the power source terminals coupled between the first power source terminal and the second power source terminal.

According to the present invention, ESD can be directly discharged from the open-drain signal terminal to the first power source terminal by using a parasitic bipolar transistor formed between the pair of a second conduction-type first region and the second conduction-type guard ring region by providing a pair of the second conduction-type first regions coupled to the open-drain signal terminal. The above-described parasitic bipolar transistor is not operable in a common use state because the parasitic bipolar transistor is not operable as long as voltage of the first power source terminal and the second power source terminal is not reversed against the common use state.

BRIEF DESCRIPTION OF THE DRAWINGS

FIG. 5A, FIG. 5B and FIG. 5C are views illustrating a problem of ESD protection in a semiconductor device having an open-drain signal terminal;

FIG. 6A and FIG. 6B are the first views illustrating a route in which electric current flows at the time of ESD application in a semiconductor device having an open-drain signal terminal;

FIG. 7A and FIG. 7B are the second views illustrating a route in which electric current flows at the time of ESD application in a semiconductor device having an open-drain signal terminal;

FIG. 8A and FIG. 8B are the third views illustrating a route in which electric current flows at the time of ESD application in a semiconductor device having an open-drain signal terminal;

FIG. 9A shows an equivalent circuit diagram for a cross sectional view taken from line A-A of FIG. 5B;

FIG. 9B shows a discharge route for a cross sectional view taken from line A-A of FIG. 5B;

FIG. 11A and FIG. 11B are views illustrating the equivalent circuit of a discharge route of whole FIGS. 5A, 5B and 5C;

FIG. 13A is a cross-sectional view taken from line B-B showing a discharge route in the semiconductor device of the first embodiment;

FIG. 13B is a cross-sectional view taken from line C-C showing a discharge route in the semiconductor device of the first embodiment;

FIG. 14A is a cross-sectional view taken from line A-A illustrating an equivalent circuit of the semiconductor device according to the first embodiment;

FIG. 14B shows a discharge route of the semiconductor device according to the first embodiment;

DETAILED DESCRIPTION

Before specific embodiments of the present invention are described, some more description of a problem related with the problem of the present invention will be added.

Figure 1:
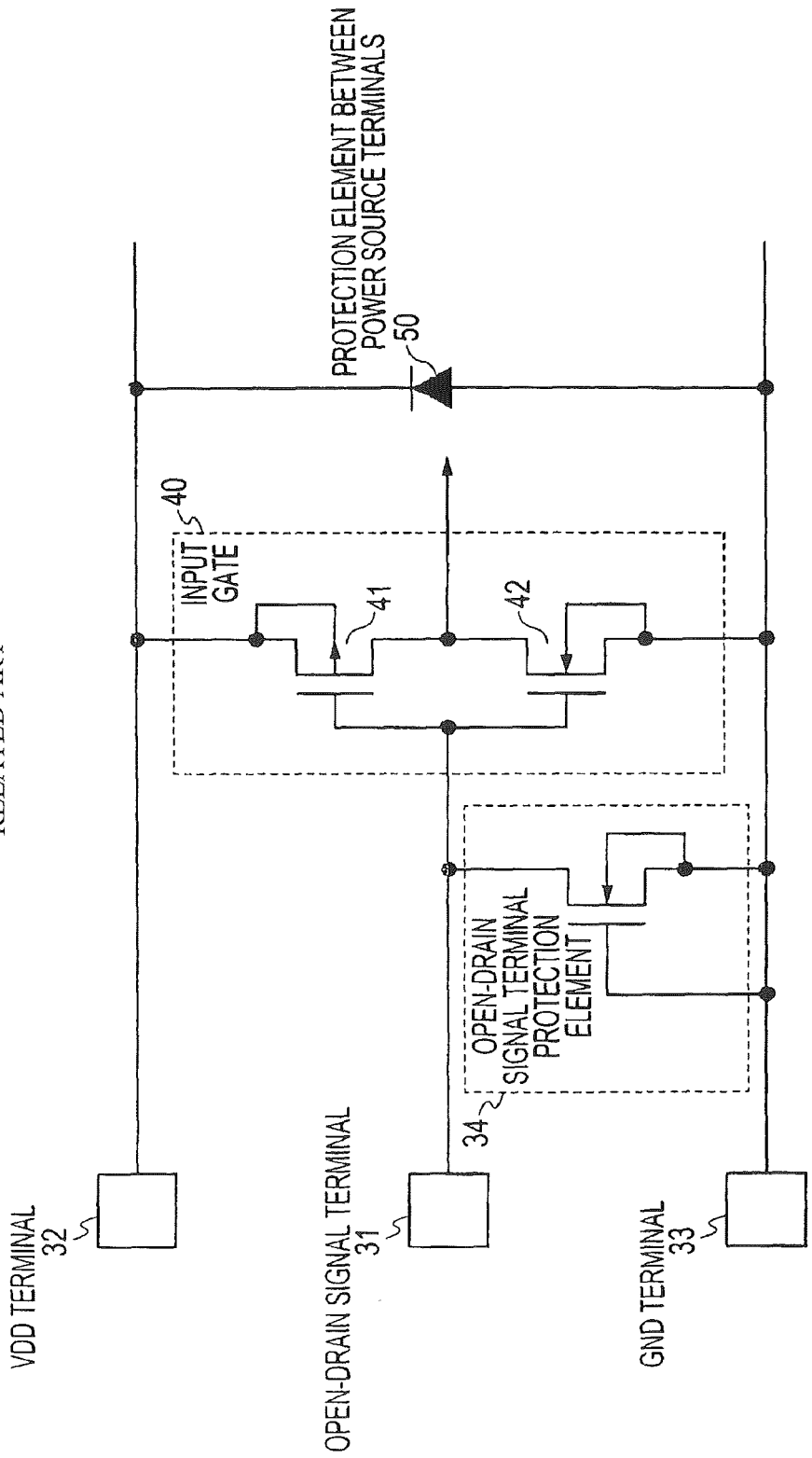
FIG. 1 is a block circuit diagram of a common open-drain signal terminal.
Figure 2:
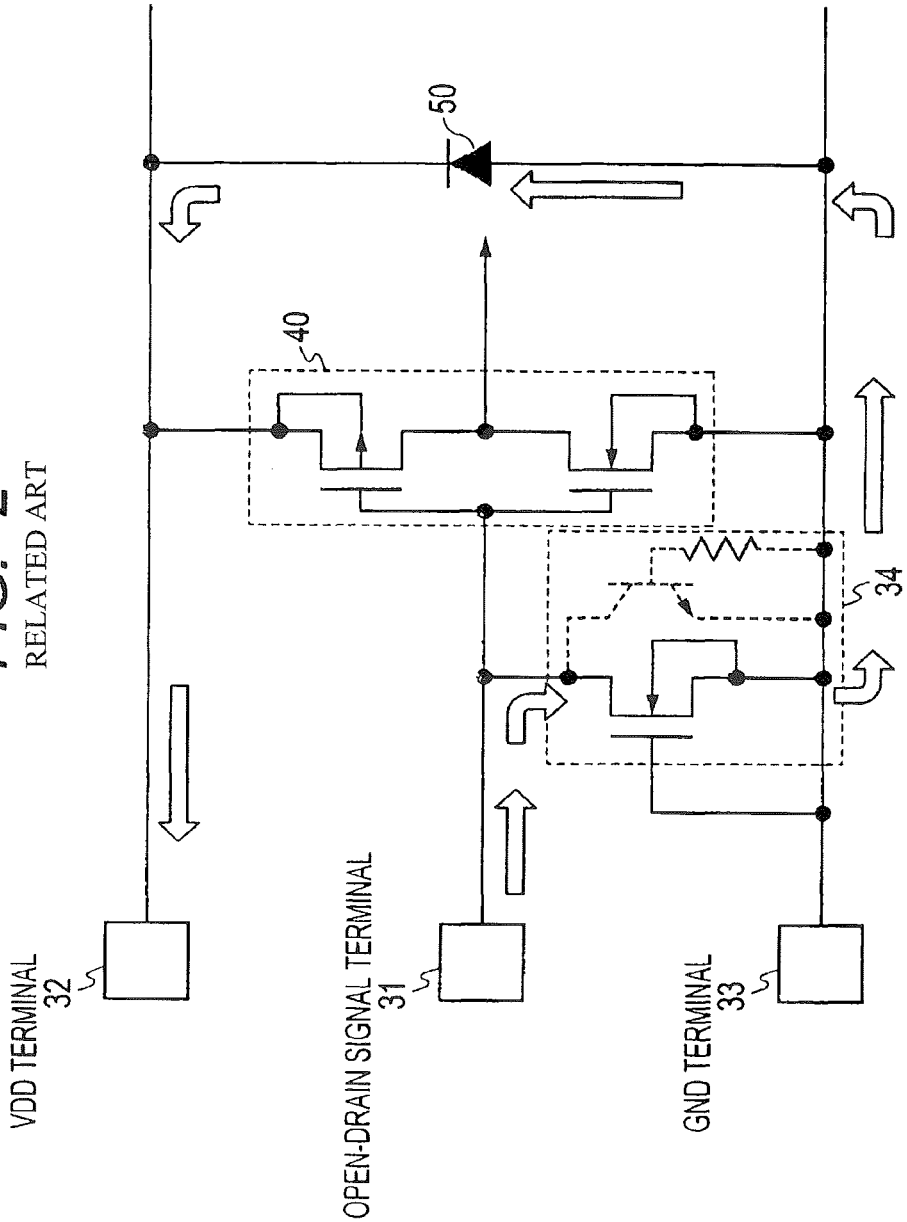
FIG. 2 is a diagram illustrating an ESD discharge route of the open-drain signal terminal in FIG. 1.
Figure 3A:
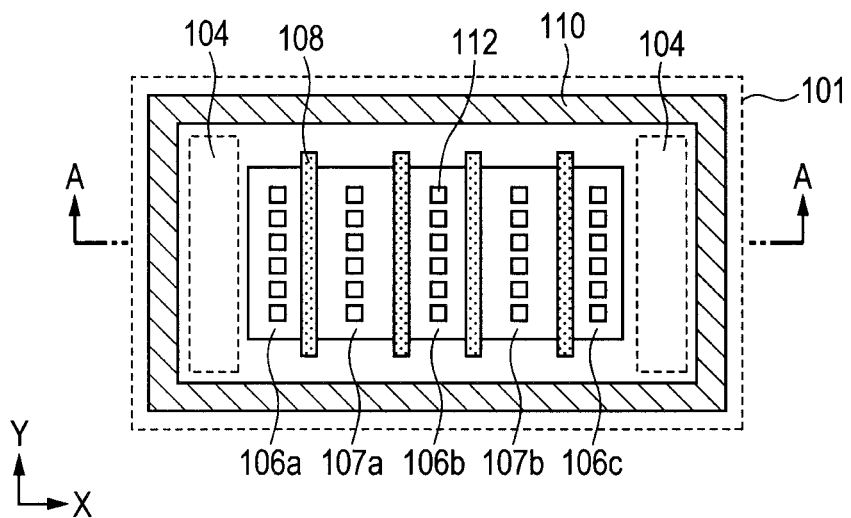
FIG. 3A is a plan view of an ESD protection circuit of a signal terminal in the related art.
Figure 3B:
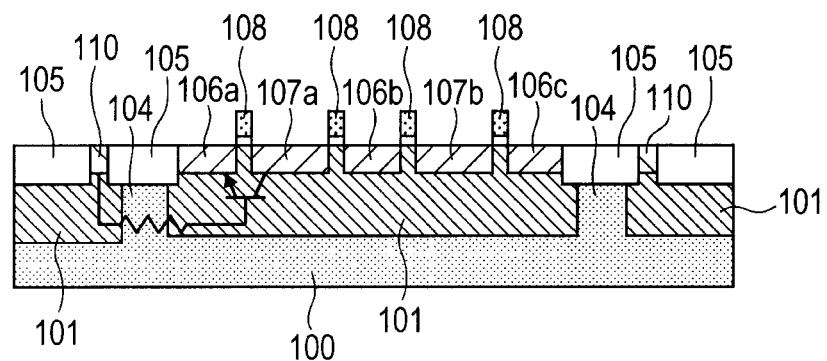
FIG. 3B is a cross-sectional view taken from line A-A of an ESD protection circuit of a signal terminal in the related art.

FIG. 5A, FIG. 5B and FIG. 5C are a plan view and cross-sectional views of a semiconductor device of a first comparative embodiment of the present invention. FIG. 5B is a plan view. FIG. 5A is a cross-sectional view thereof taken from the line B-B, and FIG. 5C is a cross-sectional view thereof taken from the line A-A. The semiconductor device of FIGS. 5A, 5B and 5C is roughly corresponding to a structure in which the protection structure described in Japanese Unexamined Patent Application Publication No. Hei 11 (1999)-274404, which is described in FIG. 3, is employed for a protection structure of an N-channel open-drain signal terminal and the structure of the ballast resistance of Japanese Unexamined Patent Application Publication No. 2005-183661 is applied to a drain of the N-channel open-drain signal terminal.

The structure of the semiconductor device of FIGS. 5A, 5B and 5C is described. A P well 101 is provided over the surface of a P-type semiconductor substrate 100. N well 102 is provided surrounding the P well 101. Multiple N-type MOS transistors are located in an X direction over the surface of the P well. The P well of FIGS. 5A and 5B is formed in such a way that the longer side of the P well is located along the X direction. In FIG. 5B, only one end of the X direction is shown and the other end is not shown in the view. However, the other end which is not shown in the view is symmetrically formed as the one end shown in the view. Length in the X direction is adequately determined depending on a driving capacity required for ESD protection and an output buffer, if necessary. Therefore, the number of N-type MOS transistors located along the X direction is determined depending on a length of the transistor along the X direction.

Each N-type MOS transistor includes each source region 106 and a drain region 107. At a distance from a gate oxide film which is not shown in the view, a gate electrode 108 is provided over the surface of the P well 101 between the source region 106 and the drain region 107 of each N-type MOS transistor. Each N-type MOS transistor other than the N-type MOS transistors located at the ends along the X direction is located with sharing the N-type MOS transistor and the source region 106 which are adjacently located in the X direction. Among N-type MOS transistors sharing the source region, the transistors are symmetrically located along an axis of a Y direction which is intersected at right angles to the X direction at the center in the X direction of the source region as an axis of symmetry.

Figure 4:
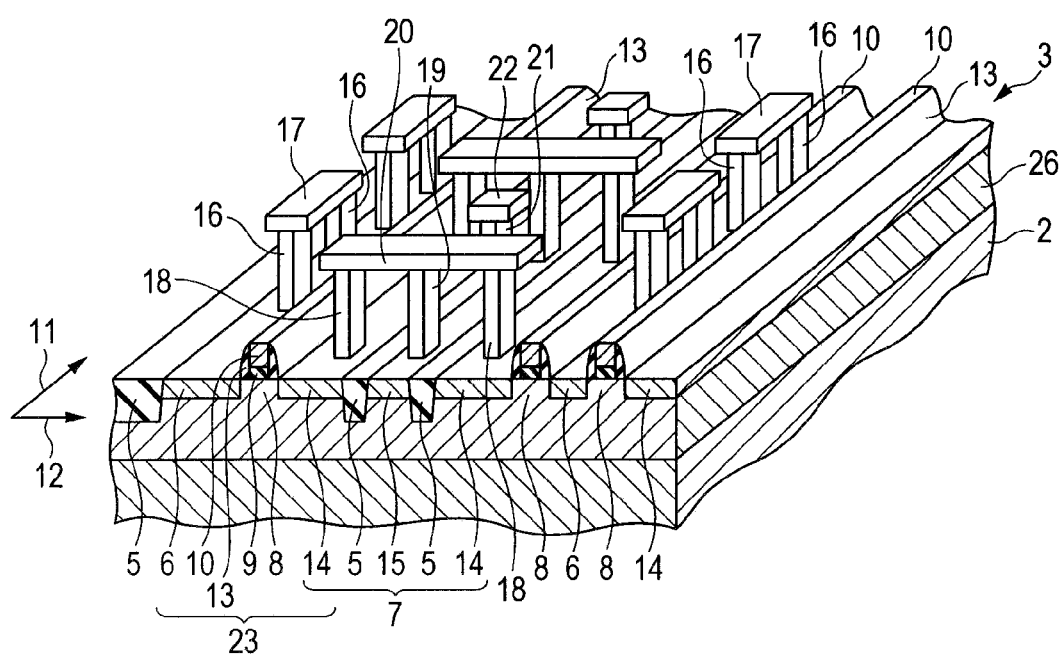
FIG. 4 is a perspective view showing a part of an ESD protection element in the related art.

An element separation region 105 is provided over the surface of the P-type semiconductor substrate 100 over which no transistors are provided. Between the drain regions 107 of the N-type MOS transistors adjacent in the X direction, an N-type high concentration region which acts as a ballast resistance region 109 spaced from the element separation region 105 is provided. As shown in the plan view of FIG. 5B, the drain region 107 of each N-type MOS transistor is once coupled to the ballast resistance region 109 from the drain region 107 through a contact 112 and a drain-ballast resistance region wiring 113, and coupled to an open-drain signal terminal 31 from the ballast resistance region 109 through a further wiring which is omitted in FIG. 5B. Here, series resistance of contact resistance of the contact 112, wiring resistance of the drain-ballast resistance region wiring 113 and diffusion layer resistance of the ballast resistance region 109 forms the ballast resistance of wiring connection from the drain region 107 to the open-drain signal terminal. The same structure of the structure shown in FIG. 4 described with reference to Japanese Unexamined Patent Application Publication No. 2005-183661 can be used for the above-described structure of the ballast resistance.

The P-type guard ring region 110 is provided over the surface of the P well 101 with surrounding whole of these N-type MOS transistors. Moreover, as similar to a related example shown in FIGS. 3A and 3B, a low concentration P-type substrate region 104 is provided over the surface of the P-type semiconductor substrate 100 between the N-type MOS transistor at the end in the X direction and the P-type guard ring. The N well 102 is provided over the surface of the P-type semiconductor substrate 100 located outside of the P well 101 in which the P-type guard ring region 110 is provided at an outer circumference of the P well. An N-type guard ring region 111 is provided over the surface of the N well 102 and the N-type guard ring region is coupled to a VDD terminal 32 as a first power source terminal through a wiring. The source region 106 and the P-type guard ring region 110 are coupled to a GND terminal 33 as a second power source terminal. A protection element between the power source terminals 50 is provided between the VDD terminal 32 and the GND terminal 33. At the time of common operation, the VDD terminal 32 and the GND terminal 33 are the power source terminals in which higher voltage than the GND terminal 33 is applied to the VDD terminal 32.

NPN-type parasitic bipolar transistors BDS1, BDS2, BDS3 and BDS4 are formed between the source and the drain of each N-type MOS transistor because of the structure of the semiconductor device. In addition, parasitic bipolar transistors BDG1, BDG2, BDG3, BDG4, BDGu1 and BDGd1 formed by the N-type region of the drain region 107 as a collector, the P well 101 and the P-type semiconductor substrate 100 as a base and the N-type guard ring region as an emitter are also formed. Other than the above-described components, the NPN-type parasitic bipolar transistors are formed in the ballast resistance region 109. However, the NPN-type parasitic bipolar transistors are not shown in the view in order to avoid complication of the view.

Subsequently, for the semiconductor device of the first comparative embodiment shown in FIGS. 5A, 5B and 5C, a route in which electric current flows between the open-drain signal terminal 31 and the VDD terminal 32 when ESD in which voltage of the open-drain signal terminal 31 is higher than the VDD terminal is applied is described using FIGS. 6A and 6B, FIGS. 7A and 7B and FIGS. 8A and 8B. Each of FIG. 6A, FIG. 7A and FIG. 8A show a structure and an electric current route at a cross-section taken from line A-A of FIG. 5B. In addition, each of FIG. 6B, FIG. 7B and FIG. 8B show a structure and an electric current route at a cross-section taken from line B-B of FIG. 5B.

A discharge route, the open-drain signal terminal 31→the ballast resistance region 109→the drain region 107→the source region 106→the GND terminal 33→the protection element between the power source terminals 50→the VDD terminal is the original discharge route as shown by outline arrows in FIG. 6A as a electric current route I1. The electric current flows from the drain region 107 to the source region 106 in a manner that the parasitic bipolar transistors BDS1 to BDS4 described in FIGS. 5A, 5B and 5C conduct the electric current.

However, as shown in an electric current route I2 of FIG. 7, from the GND terminal to the VDD terminal, surge current also flows to the VDD terminal through a route, the GND terminal 33→the P-type guard ring region 110→the P well 101→the N well 102→the N-type guard ring region 111, other than the route through the protection element between the power source terminals 50.

In the electric current route I2 shown in FIGS. 7A and 7B, when electric current flows from the GND terminal 33 to VDD terminal 32, base current is supplied to the parasitic bipolar transistors BDG1, BDG2, BDG3, BDG4, BGDu1 and BDGd1 existing between the drain region 107 and the N-type guard ring region 111. As a result, the parasitic bipolar transistors BDG1, BDG2, BDG3, BDG4, BDGu1 and BDGd1 start to operate. Among these parasitic bipolar transistors BDG1, BDG2, BDG3, BDG4, BDGu1 and BDGd1, the parasitic bipolar transistors having the smallest base region (near by the N-type guard ring region 111 and N well 102) BDG1, BDGu1 and BDGd1 are easiest to operate compared with the other parasitic bipolar transistors BDG2, BDG3 and BDG4 and has higher electric current when they operate (refer to a electric current route I3 in FIG. 8). Therefore, the electric current is concentrated on the parasitic bipolar transistors BDS1, BDG1, BDGu1 and BDGd1, and the drain region 107 (the drain diffusion layer) forming the parasitic bipolar transistors BDS1, BDG1, BDGu1 and BDGd1 are broken down.

FIGS. 9A and 9B are views showing a circuit diagram image by extracting parasitic elements shown in a cross-sectional view taken from line A-A of FIG. 5C. Discharge routes shown in cross-sectional views taken from line A-A of FIG. 6A, FIG. 7A and FIG. 8A are overlapped. In order to avoid complication of the views, only electric current flowing to the parasitic bipolar transistor BDS1 and BDG1 is shown. Illustration of electric current flowing to the parasitic bipolar transistors BDS2 to BDS4 and BDG2 to BDG4 is omitted. The diode shown in the views shows a diode property of the protection element between the power source terminals 50. For a discharge route, the electric current route I1 is a route, the open-drain signal terminal 31→a BDS1 collector→a BDS1 emitter→the protection element between the power source terminals 50→the VDD terminal 32. The electric current route I2 is a route, which is branched from the BDS1 emitter (that is, the GND terminal 33) of the electric current route, a BDG1 base→a BDG1 emitter→the VDD terminal 32. In addition, the electric current route I3 is a route, the open-drain signal terminal 31→a BDG1 collector→a BDG1 emitter→the VDD terminal.

Figure 10:
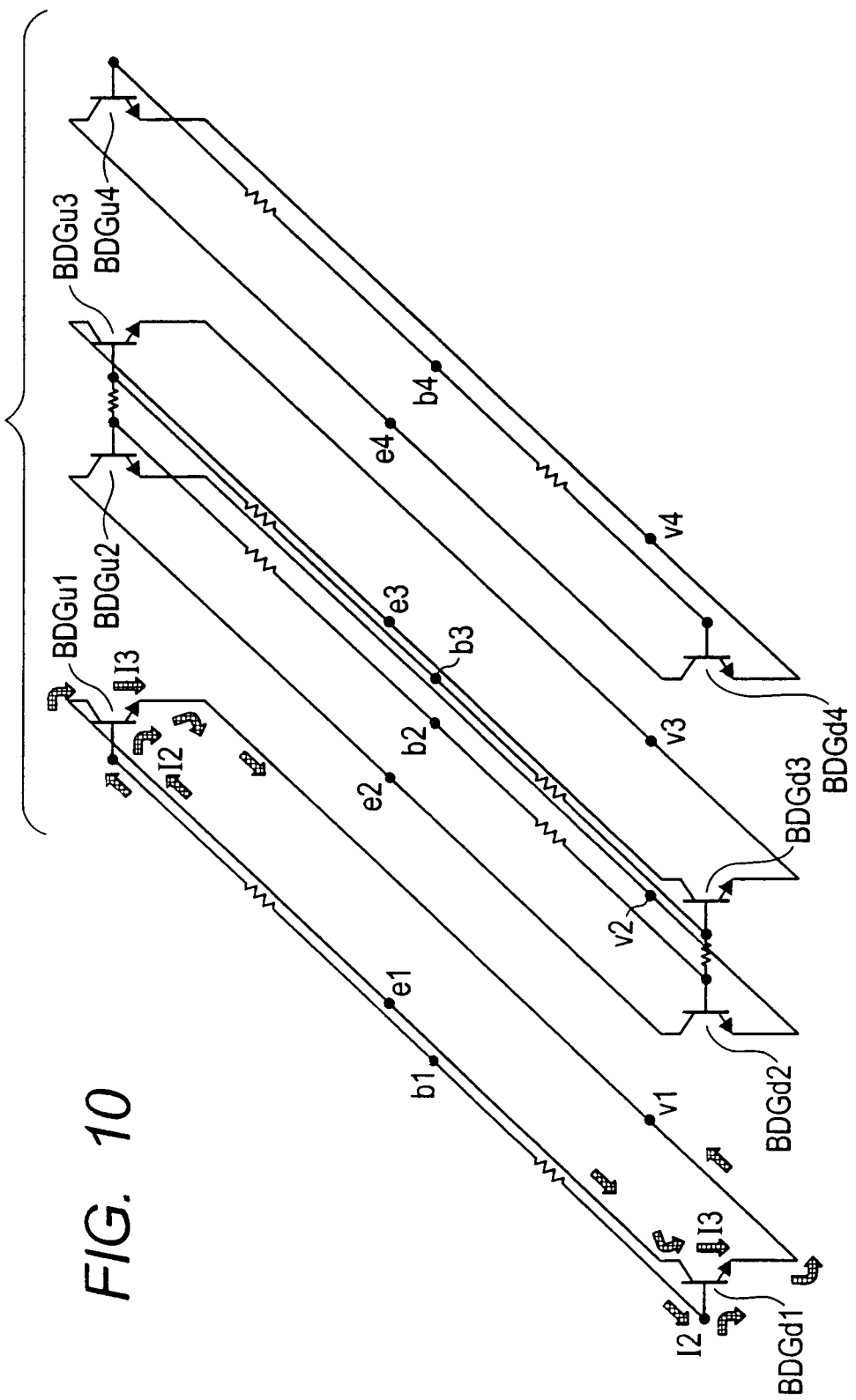
FIG. 10 are a cross-sectional view illustrating the equivalent circuit a discharge route taken from line B-B of FIG. 5B.

FIG. 10 is a view showing a circuit diagram image by extracting parasitic elements shown in a cross-section in the Y direction (the same direction in a cross-sectional view taken from line B-B of FIG. 5A). In FIG. 5A, only a cross-sectional view taken from line B-B is shown. However, FIG. 10 shows eight parasitic bipolar transistors BDGu1 to BDGu4 and BDGd1 to BDGd4 formed between the N-type guard ring region 111 which is located at both sides of each of four drain regions 107a to 107d shown in FIG. 5B in the Y direction and each drain region 107a to 107d. Also in this FIG. 10, for a route in which electric current flows to the parasitic elements, only a route in which ESD current flows through the parasitic bipolar transistor BDGu1 and BDGd1 is shown. In FIG. 10, electric current flowing from the base to the emitter of the parasitic bipolar transistor BDGu1 and BDGd1 is the electric current of the electric current route I2. Electric current flowing from the collector to the emitter is the electric current of the electric current route I3.

A view in which FIG. 9 and FIG. 10 are coupled at connection points e1 to e4, b1 to b4 and v1 to v4 is FIG. 11A. Also in FIG. 11A, in order to avoid complication of the view, illustration of the parasitic bipolar transistors BDGu1 to BDGu4 are omitted. FIG. 11B shows a discharge route in which ESD current flows to the parasitic bipolar transistors BDS1, BDG1 and BDGd1. The electric current routes I1 and I3 illustrated in FIGS. 6A and 6B, FIGS. 7A and 7B and FIGS. 8A and 8B are shown in solid line arrows and the electric current route I2 is shown in dashed line arrows. As described previously, the electric current route I1 is the route in which electric current flows from the open-drain signal terminal 31 to the VDD terminal 32 through the collector and the emitter of BDS1 and the protection element between the power source terminals 50. The electric current route I2 is the route in which electric current branches from the emitter of BDS1 (or the GND terminal 33) in the electric current route I1 to the VDD terminal 32 through from the base to the emitter of BDG1 and BDGd1. The electric current route I3 is the route in which electric current flows from the open-drain signal terminal 31 to the VDD terminal 32 through from the collector to the emitter of BDG1 and BDGd1. The electric current is concentrated on the parasitic bipolar transistors BDS1, BDG1 and BDGd1 (although illustration of BDGu1 is omitted, the same phenomenon occurs in BDGu1) shown in FIG. 11B and the drain diffusion layers are broken down.

By microscopic operation in process, the protection element itself becomes microscopic. As a result, a gate pitch tends to be narrow and a width of the drain diffusion layer d (shown in FIG. 5B) tends to be small. Accordingly, drain diffusion layer breakdown becomes easy to occur. When the width of the drain diffusion layer d is increased in order to avoid the breakdown, the gate pitch becomes large and area of the protection element becomes large.

First Embodiment

Figure 12A:
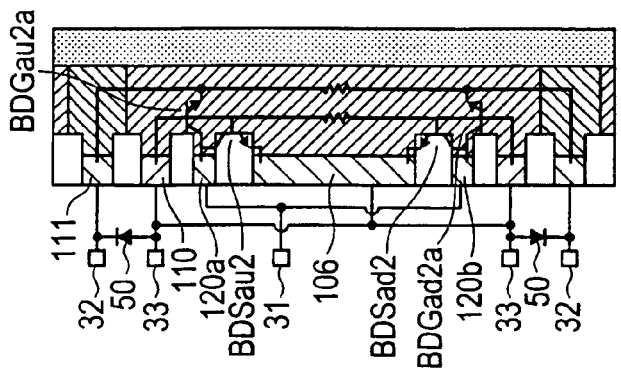
FIG. 12A is a cross-sectional view taken from line B-B of a semiconductor device according to a first embodiment of the present invention.
Figure 12B:
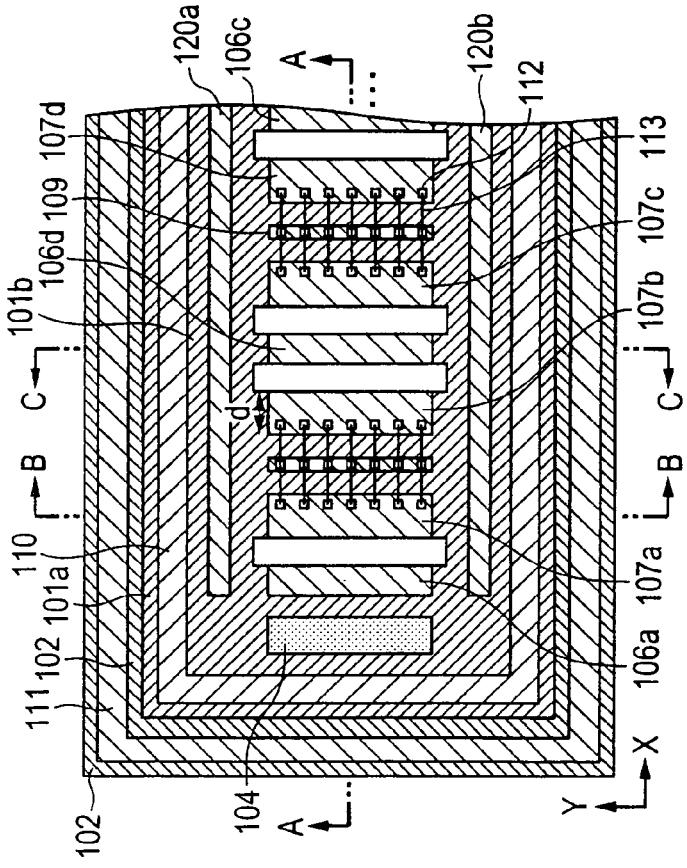
FIG. 12B is a plan view of a semiconductor device according to the first embodiment of the present invention.
Figure 12C:
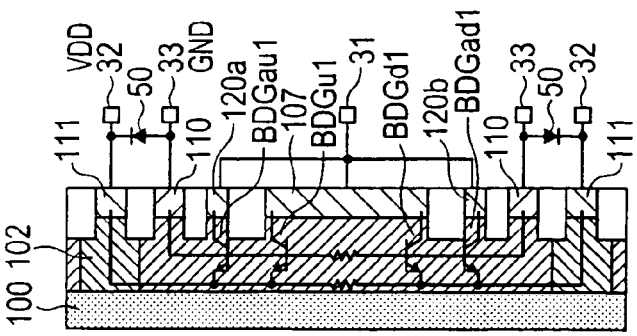
FIG. 12C is a cross-sectional view taken from line C-C of a semiconductor device according to the first embodiment of the present invention.
Figure 12D:
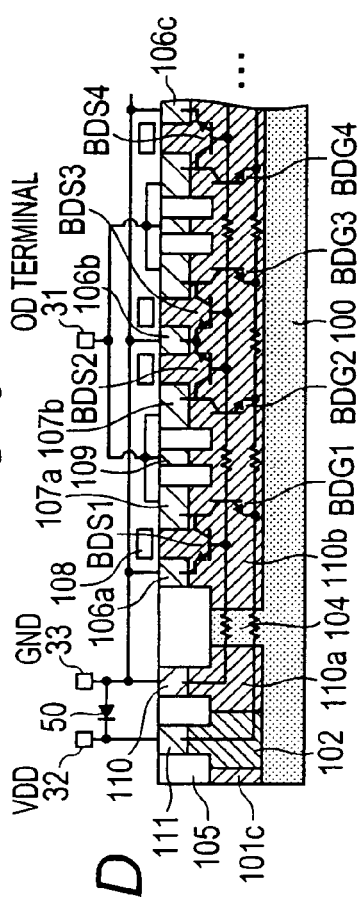
FIG. 12D is a cross-sectional view taken from line A-A of a semiconductor device according to the first embodiment of the present invention.

A plan view and cross-sectional views of a semiconductor device according to the first embodiment of the present invention are shown in FIGS. 12A, 12B, 12C and 12D. FIG. 12B is the plan view. FIG. 12A is a cross-sectional view of FIG. 12B taken from line B-B. FIG. 12C is a cross-sectional view of FIG. 12B taken from line C-C. FIG. 12D is a cross-sectional view of FIG. 12B taken from line A-A.

A structure of the semiconductor device of the first embodiment is described using FIGS. 12A, 12B, 12C and 12D. In FIGS. 12A, 12B, 12C and 12D, the same reference numeral is assigned for parts in which structure and function are almost the same as the first comparative embodiment described in FIGS. 5A, 5B and 5C and redundant descriptions are omitted.

Bypass regions (second conduction-type first regions) 120a, 120b are provided in the semiconductor device of the first embodiment shown in FIGS. 12A, 12B, 12C and 12D, compared to the first comparative embodiment of FIGS. 5A, 5B and 5C. The bypass regions 120a, 120b are provided along a direction where electric current of multiple N-type MOS transistors located along the X direction over the surface of the P well 101 flows (the X direction) and locate at both sides along a direction intersecting at right angles to a direction where electric current of each N-type MOS transistor flows (the Y direction). The bypass regions 120a and 120b are N-type high concentration regions provided over the surface of the P well 101.

According to a cross-sectional view taken from line B-B shown in FIG. 12A, the bypass regions 120a, 120b are provided over the surface of the P wells 101 which are located at both sides of the sandwiched drain region 107. The P-type guard ring region 110 is provided over the surface of P well 101 located outside of the above-described P wells. The N-type guard ring region 111 is located over the surface of P-type semiconductor substrate 100 located further outside of the above-described P well. According to this structure, vertical-type parasitic bipolar transistors BDGau1 and BDGad1 in which the bypass regions 120a, 120b act as each collector are formed near the N well 102 and the N-type guard ring region 111 compared with vertical-type parasitic bipolar transistors BGDu1 and BDGd1 in which the drain regions act as collectors. The base of these NPN-type parasitic bipolar transistors BDGau1 and BDGad1 is coupled to the P-type guard ring region 110 through the P well 101 and the P-type guard ring region 110 is further coupled to the GND terminal 33 with a wiring. The emitter is coupled to the N-type guard ring region 111 through the N well 102 and the N-type guard ring region 111 is further coupled to the VDD terminal 32 with a wiring. The bypass regions 120a, 120b acting as collectors are coupled to the open-drain signal terminal 31 with a wiring.

As shown in a cross-sectional view taken from line C-C shown in FIG. 12C, the bypass regions 120a, 120b are provided over the surface of P wells 101 which are located at both sides of the sandwiched source region 106. The P-type guard ring region 110 is provided over the surface of P well 101 located outside of the above-described P wells. The N-type guard ring region 111 is provided over the surface of P-type semiconductor substrate 100 located further outside of the above-described P well. According to this structure, vertical-type parasitic bipolar transistors BDGau2a and BDGad2a are formed in which the bypass regions 120a, 120b act as each collector as similar to FIG. 12A. Similar to BDGau1 and BDGad1, the bases of these NPN-type parasitic bipolar transistors BDGau2 and BDGad2 are coupled to the P-type guard ring region 110 through the P well 101 and the emitters of these terminals are coupled to the N-type guard ring region 111 through the N well 102. The bypass regions 120a, 120b acting as collectors are coupled to the open-drain signal terminal 31 with a wiring.

Horizontal-type parasitic bipolar transistors BDSau2 and BDSad2 in which the bypass regions 120a, 120b act as each collector and the bases of the transistors are coupled to the P-type guard ring region 110 though the P well 101 and the emitters of the terminals are coupled to the source region 106 are farmed. The other structures are almost the same structure as the first comparative embodiment shown in FIGS. 5A, 5B and 5C.

For the semiconductor device of the first embodiment, when ESD which has higher voltage of the voltage of the open-drain signal terminal 31 than the voltage of the VDD terminal 32 is applied between the open-drain signal terminal 31 and the VDD terminal 32, a route in which the electric current flows is described with further reference to FIGS. 13A and 13B. FIG. 13A is a view illustrating a route in which ESD current flows in a cross-section taken from line B-B of FIG. 12B. FIG. 13B is a view illustrating a route in which ESD current flows in a cross-section taken from line C-C of FIG. 12B. In FIG. 13A, a electric current routes I1 to I3 is the same routes of the first comparative embodiment in which discharge current flows shown in FIGS. 6A and 6B to FIGS. 11A and 11B. In FIG. 13A, when electric current flows through the GND terminal 33→the P-type guard ring region 110→the P well 101→the N well 102→the N-type guard ring region 111→the VDD terminal 32 along the electric current route I2 between the GND terminal 33 and the VDD terminal 32, base current flows to the vertical-type parasitic bipolar transistors BDGau1 and BDGad1 by the electric current from the P well 101 to N well 102. As a result, the vertical-type parasitic bipolar transistors BDGau1 and BDGad1 conduct the electric current, and current I4 flows from the bypass regions 120a, 120b coupled to the open-drain signal terminal 31 to the N-type guard ring region coupled to the VDD terminal though the parasitic bipolar transistors BDGau1 and BDGad1.

Similarly, with reference to FIG. 13B, along the electric current route I2 between the GND terminal 33 and the VDD terminal 32, electric current which flows from the P well 101 to the N well 102 acts as base current. As a result, both of the vertical-type parasitic bipolar transistors BDGad2a and BDGau2a conduct electric current and the electric current flows from the open-drain signal terminal 31 to the VDD terminal through the electric current route I4. In addition, the horizontal-type parasitic bipolar transistors BDSad2 and BDSau2 also conduct electric current and discharge current (ESD current) flows through a route, the open-drain signal terminal 31→the bypass regions 120a, 120b→the P well 101→the source region 106→the GND terminal 33→the protection element between the power source terminals 50→the VDD terminal 32 along an electric current route I5. Therefore, as the electric current route I3 of the first comparative embodiment shown in FIGS. 8A and 8B and other views, electric current does not concentratedly flow to a part of parasitic bipolar transistors (BDS1, BDG1, BDGu1 and BDGd1) and the electric current also dispersedly flows to the electric current route I4 and I5. As a result, generation of a problem in which electric current concentratedly flows to a part of the drain regions and the drain regions are broken down can be avoided.

FIG. 14A is a view of an equivalent circuit showing a parasitic element in a cross-section taken from line A-A of FIG. 12B as a circuit diagram image. FIG. 14B shows a route in which electric current flows to the circuit. In the cross-section taken from line A-A of FIG. 12B, there is no major difference in the equivalent circuit of FIGS. 9A and 9B shown as the first comparative embodiment and the route in which electric current flows.

Figure 15:
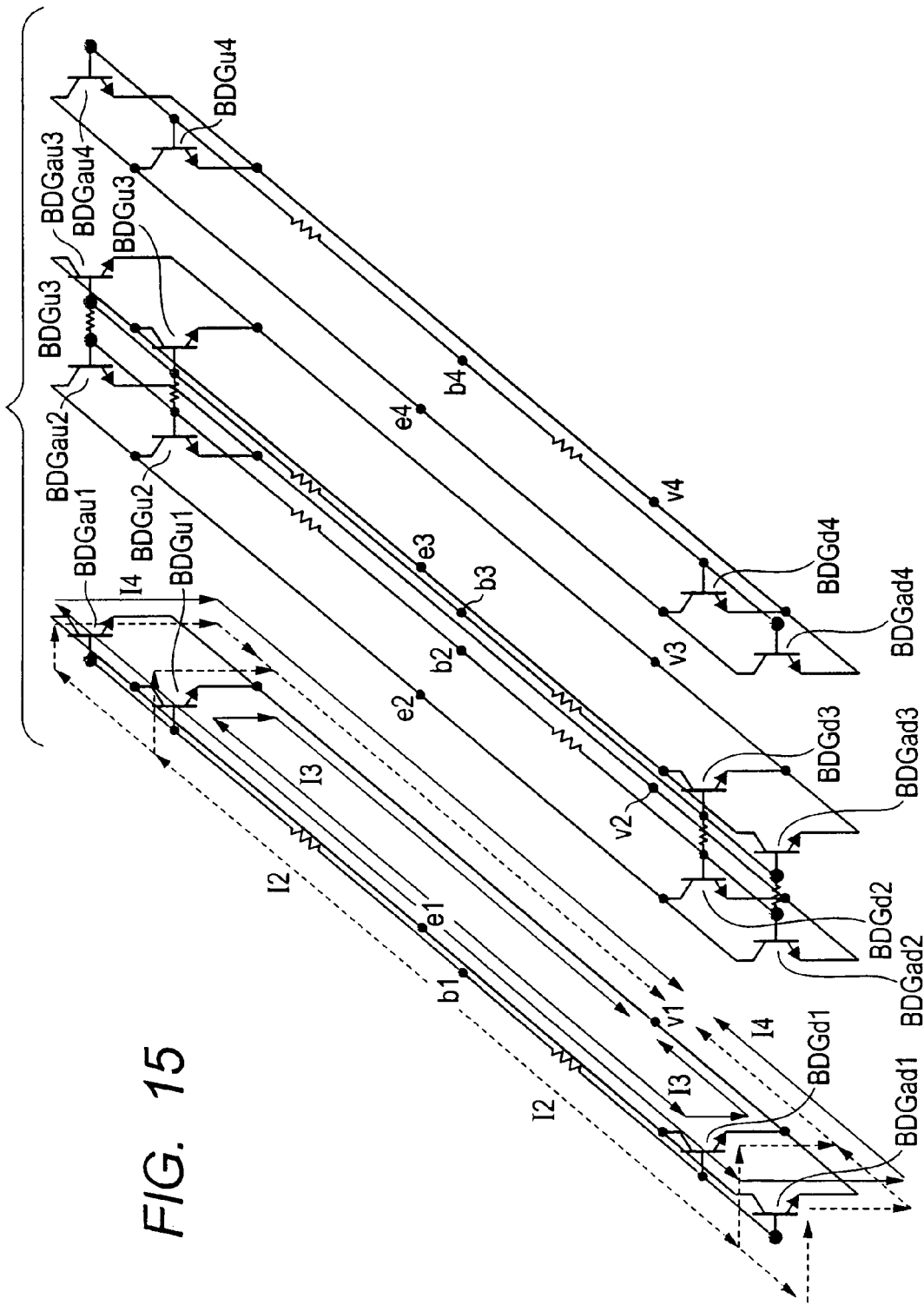
FIG. 15 is a cross-sectional view illustrating an equivalent circuit and a discharge route of the semiconductor device according to the first embodiment taken from line B-B.

FIG. 15 is a view in which, in each of the drain region 107a to 107d of FIG. 12B, a parasitic element is extracted at a cross-section in the Y direction (the same direction as a cross-sectional view taken from line B-B shown in FIG. 12A) to from a circuit diagram image. In FIG. 12A, only a cross-sectional view taken from line B-B of the drain region 107a is shown among four drain regions 107a to 107d. However, in addition to eight parasitic bipolar transistors BDGu1 to BDGu4 and BDGd1 to BDGd which are formed between N-guard ring region 111 which is located at both sides of each of four drain regions 107a to 107d shown in FIG. 12B in the Y direction and each drain region 107a to 107d, sixteen in total parasitic bipolar transistors containing other vertical-type parasitic bipolar transistors BDGau1 to BDGau4 and BDGad1 to BDGad4 which are formed between the bypass regions 120a, 120b and the N-type guard ring region 111 in the same cross-section in the Y direction are shown. In this FIG. 15, a route of the electric current route I2 in which base current of each above-described parasitic bipolar transistor flows from the P-type guard ring region 110 to the N-type guard ring region 111 is shown in dashed lines. A route of the electric current route I3 in which electric current flows from the collectors to emitters of the parasitic bipolar transistors BDGu1 to BDGu4 and BDGd1 to BDGd is shown in solid lines. A route of the electric current route I4 in which electric current flows from the collectors to emitters of the parasitic bipolar transistors BDGau1 to BDGau4 and BDGad1 to BDGad is shown in solid lines.

Figure 16:
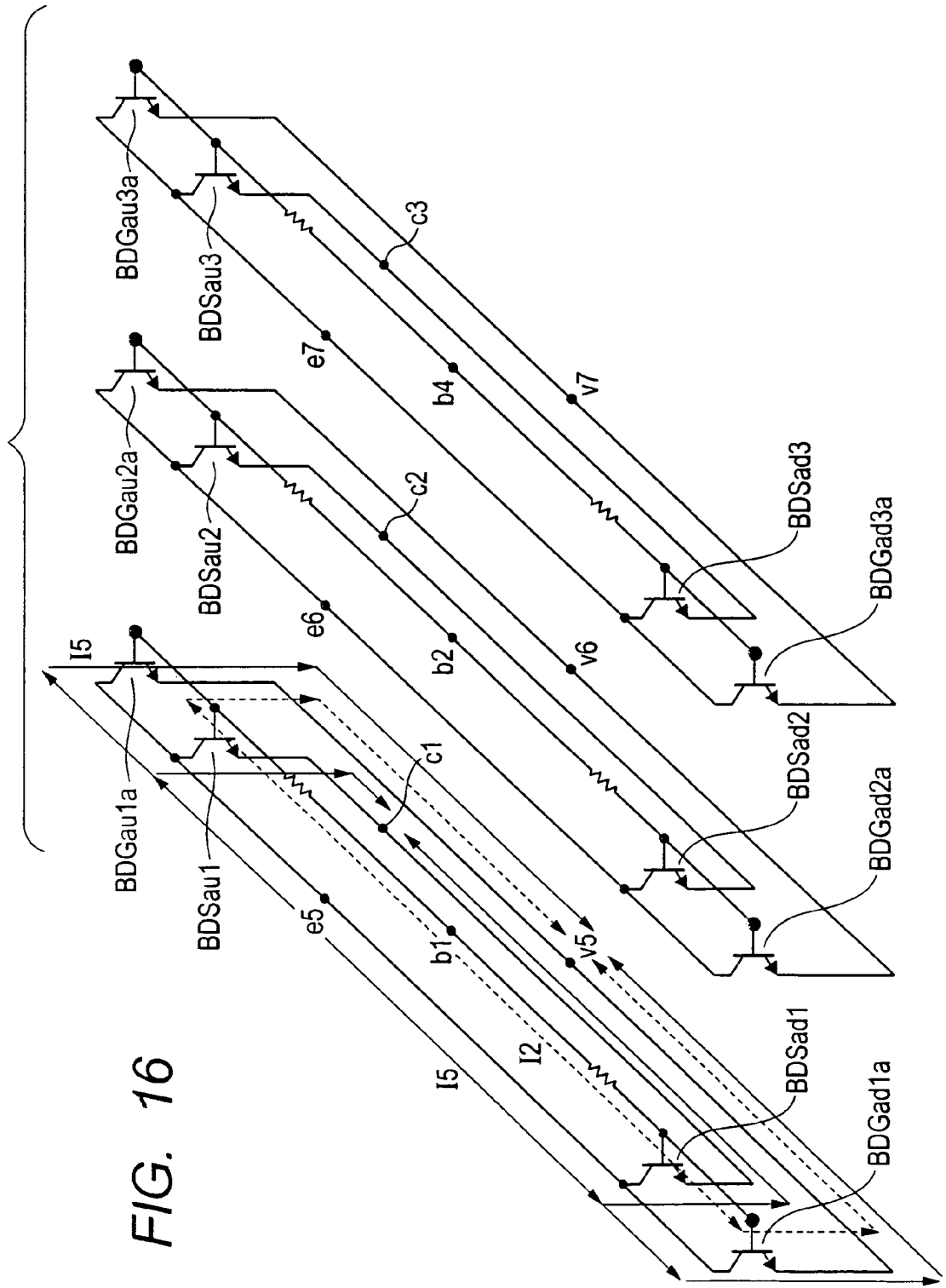
FIG. 16 is a cross-sectional view illustrating the equivalent circuit and the discharge route of the semiconductor device according to the first embodiment taken from line C-C.

FIG. 16 is a view in which, in each of the source region 106a to 106c of FIG. 12B, a parasitic element is extracted at a cross-section in the Y direction (the same direction as a cross-sectional view taken from line C-C shown in FIG. 12C) to form a circuit diagram image. In FIG. 12C, only a cross-sectional view taken from line C-C of the source region 106b among the three source regions 106a to 106c is shown. In FIG. 12C, however, 12 in total parasitic bipolar transistors containing each of horizontal-type parasitic bipolar transistor BDSau1 to BDSau3 and BDSad1 to BDSad3 which are formed between three source regions 106a to 106c and the bypass region 120a and 120b shown in FIG. 16B, and vertical-type parasitic bipolar transistors BDGau1a to BDGau3a and BDGad1a to BDGad3a which are formed between the bypass regions 120a, 120b and the N-type guard ring region 111 in the same cross-section in the Y direction are shown. In this FIG. 16, a route of the electric current route I2 in which base current of parasitic bipolar transistors flows from the P-type guard ring region 110 to the N-type guard ring region 111 is shown in dashed lines. A route of an electric current route I5 in which electric current flows from the collectors to emitters of the parasitic bipolar transistors BDSau1 to BDSau3, BDSad1 to BDSad3, BDGau1a to BDGau3a and BDGad1a to BDGad3a is shown in solid lines.

Figure 17:
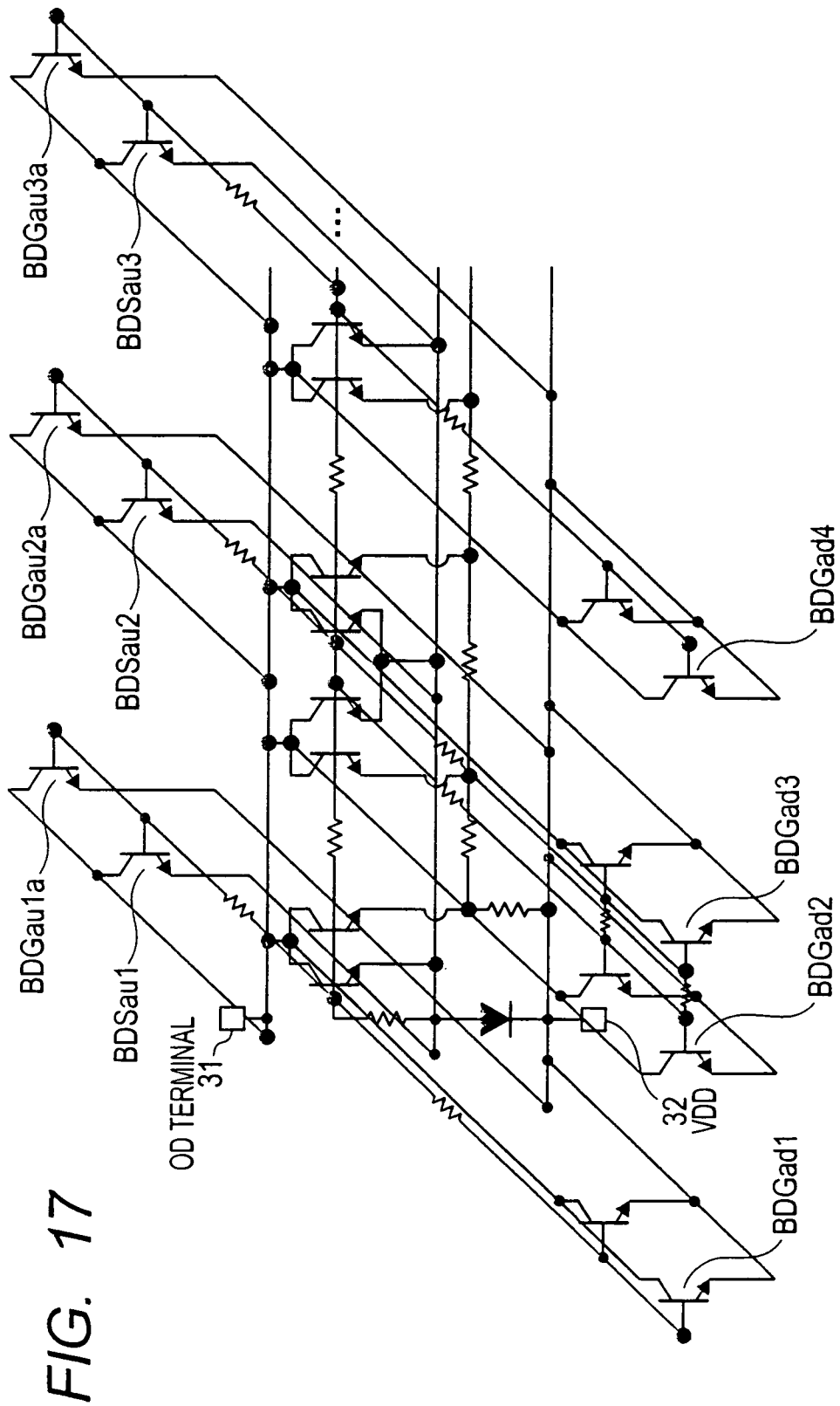
FIG. 17 is a view illustrating the equivalent circuits and the discharge routes of all parts shown in FIGS. 14A and 14B to FIG. 16 of the semiconductor device according to the first embodiment.

FIG. 17 is a view in which FIGS. 14A and 14B, FIG. 15 and FIG. 16 are coupled at connection points e1 to e7, b1 to b4, c1 to c3 and v1 to v7. In FIG. 17, in order to avoid complication of the view, illustration of the parasitic bipolar transistors BDGau1 to BDGau4, BDGu1 to BDGu4, BDGad1a to BDGada4, BDSad1 to BDSad4 and BDGad1 to BDGad4 are omitted.

When FIG. 17 which is an equivalent circuit diagram showing a discharge route of the first embodiment is compared to FIG. 11A which is an equivalent circuit diagram of the first comparative embodiment, an area of the emitter increases by adding the diffusion layer (the bypass regions, the second conduction-type first region 120a, 120b) forming parasitic bipolar transistors BDGau1, BDGad1, BDGau1a, BDGad1a, BDSau1 and BDSad1. As a result, when the same electric current as electric current which breaks down the drain diffusion layer in the related art flows, breakdown of the drain diffusion layer (the drain region 107a) located at the end in the X direction forming the parasitic bipolar transistors BDS1 and BDS2 can be suppressed. The base current of the parasitic bipolar transistors BDS2 to BDS4 can be increased and impedances of parasitic bipolar transistors BDS2 to BDS4 can be lowered by flowing electric current to the parasitic bipolar transistors BDGau2 to BDGau4, BDGad2 to BDGad4, BDGau2a to BDGau4a, VDGad2a to BDGad4a, BDSau2 to BDSau4 and BDSad2 to BDSad4. As a result, the electric current is easy to be dispersed and concentration of the electric current to the parasitic bipolar transistors BDS1 and BDG1 can be avoided.

In the case that an open-drain signal terminal protection element (an Nch protection element) provided between the open-drain signal terminal 31 and the GND terminal 33 is operated as a diode, for example, in the case of applying negative charge to the open-drain signal terminal 31 with setting the VDD terminal 32 in common, this case contributes to increase in a level of ESD resistance because electric current flows between the base and the collector of the parasitic bipolar transistors in which the bypass regions 120a, 120b act as collectors.

Figure 18:
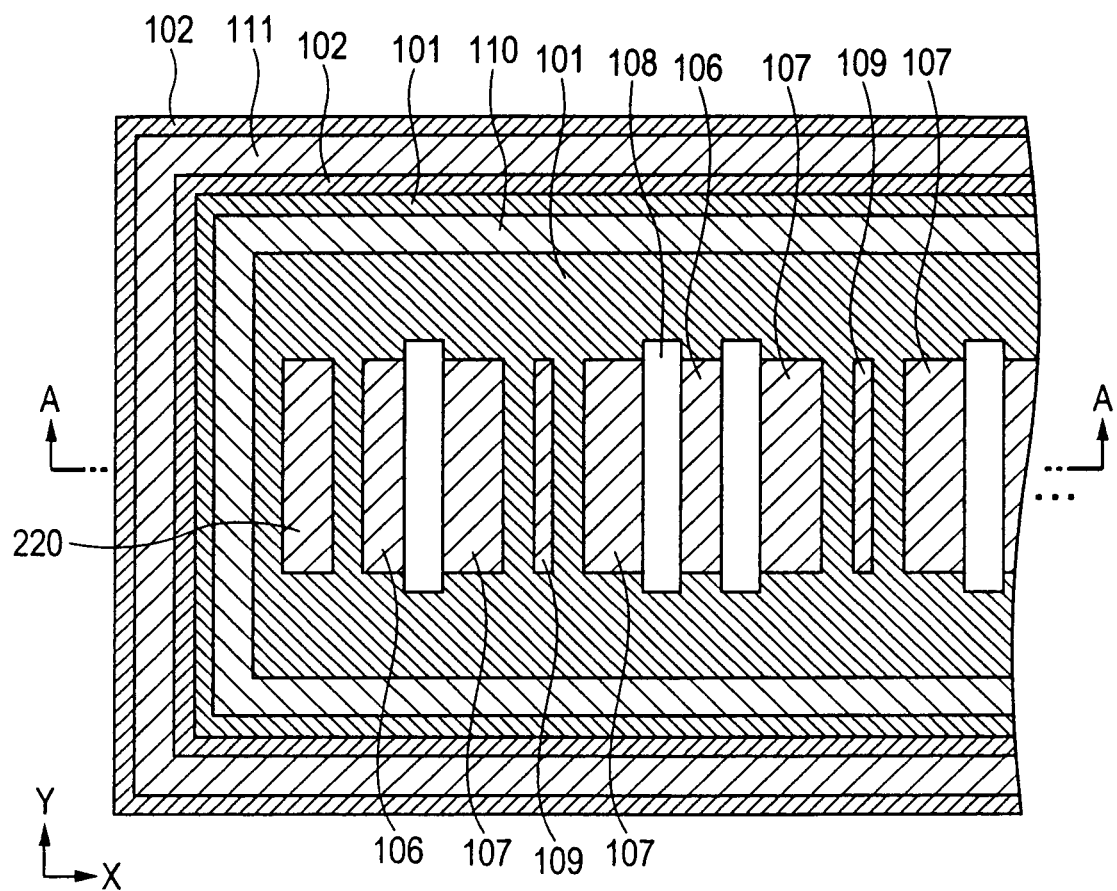
FIG. 18 is a plan view showing a semiconductor device of a second comparative embodiment.
Figure 19:
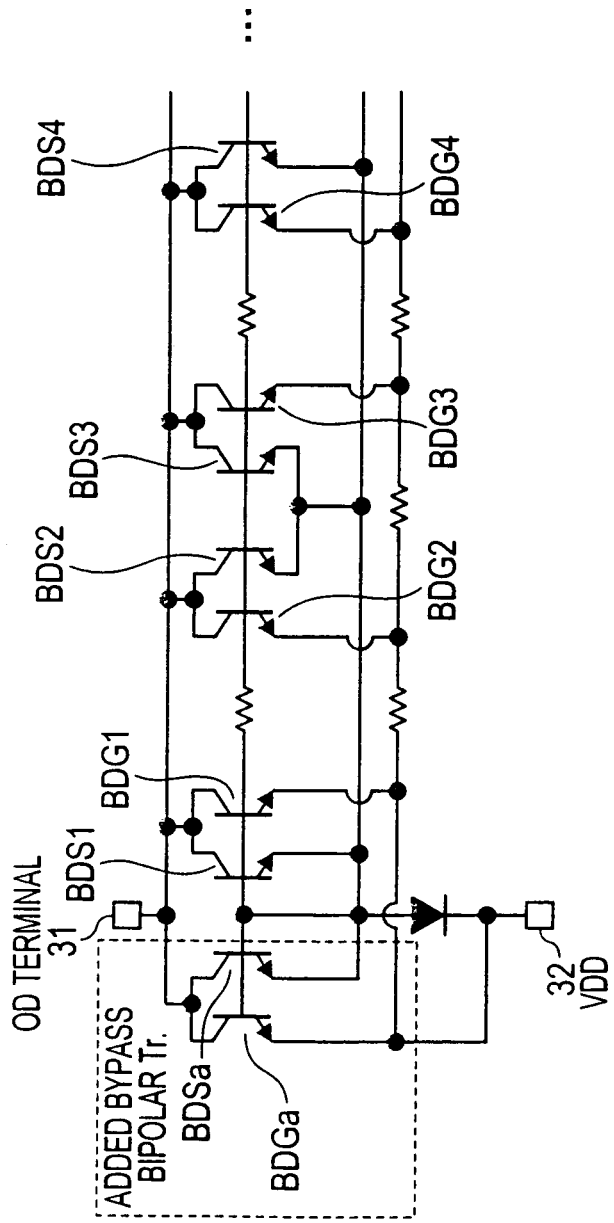
FIG. 19 is a view of an equivalent circuit showing a discharge route of the semiconductor device of the second comparative embodiment.

FIG. 18 is a plan view showing a semiconductor device of the second comparative embodiment. In the second comparative embodiment, the bypass regions 120a, 120b are located at the end in a direction where electric current flows (a bypass region 220), while in the first embodiment, they are provided at both sides of the MOS transistor along a direction where the electric current of the MOS transistor flows (the X direction). An equivalent circuit diagram when the semiconductor device of the second comparative embodiment functions as an ESD protection element is shown in FIG. 19. As shown in FIG. 19, parasitic bipolar transistors BDSa and BDGa are formed as a bypass route. However, it is not much different that electric current concentrates on the parasitic bipolar transistors BDS1, BDG1, BDSa and BDGa located at the end in the X direction. From the viewpoint of uniform operation, it is effective that the bypass regions 120a, 120b are located along a direction where the electric current of the MOS transistor flows (the X direction) as the first embodiment as a unit of reducing impedances of the parasitic bipolar transistors BDS2 to BDS4 and BDG2 to BDG4 in order to flow electric current also to the parasitic bipolar transistors BDS2 to BDS4 and BDG2 to BDG4.

It also can be considered that the bypass regions are located between the guard rings in a ring shape surrounding the MOS transistor. However, since the diffusion layer (the bypass region) is required to be located sandwiching the element separation region, an area in a direction where the electric current of the MOS transistor flows (a direction intersecting to the gate at right angles, the X direction) is increased.

Second Embodiment

Figure 20:
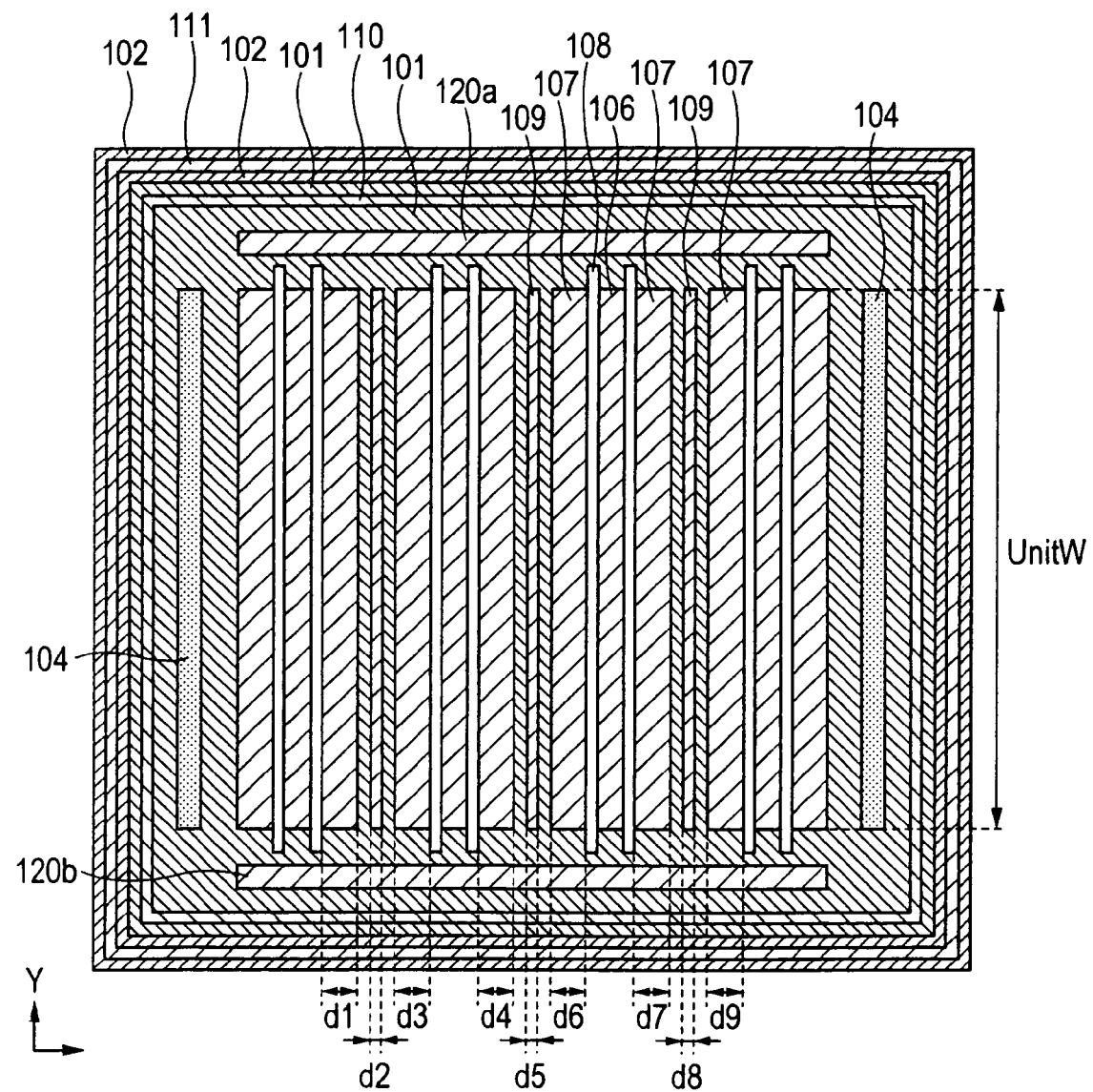
FIG. 20 is a plan view showing the semiconductor device according to a second embodiment.

FIG. 20 is a plan view of a semiconductor device of the second embodiment. The same reference numeral is assigned for parts in which structures are the same as the first embodiment and redundant illustrations are omitted. Although illustration of wiring of a ballast resistance part is omitted, the structure of the part is similar to the first embodiment. In the second embodiment shown in FIG. 20, when a channel width of the MOS transistor is represented as unitW, a length of unitW is longer than the total of lengths in a direction where the electric current of the drain regions 107 of each transistor and the MOS transistors in the ballast region 109 flows (a direction intersecting to the gate at right angles). More specifically, Formula (1) is effected when lengths in the X direction of each drain region are defined as d1, d3, d4, d6, d7 and d9 and lengths in the X direction of each ballast resistance region are defined as d2, d5 and d8.

$$\text{unit}W > d1 + d2 + \ldots + d9 \qquad \text{Formula (1)}$$

When Formula (1) is effected, impedance of a parasitic bipolar transistor in which the drain region 107 located at the end in the X direction is a collector, the P-type guard ring region 110 being a base and the N-type guard ring region 111 being an emitter is lowered. Consequently, electric current is easy to concentrate on the drains at the both ends in the X direction. In this case, concentration of electric current to the drains at the both ends can be avoided by adding a transistor which folds in the source region at the end in the X direction.

Third Embodiment

Figure 21:
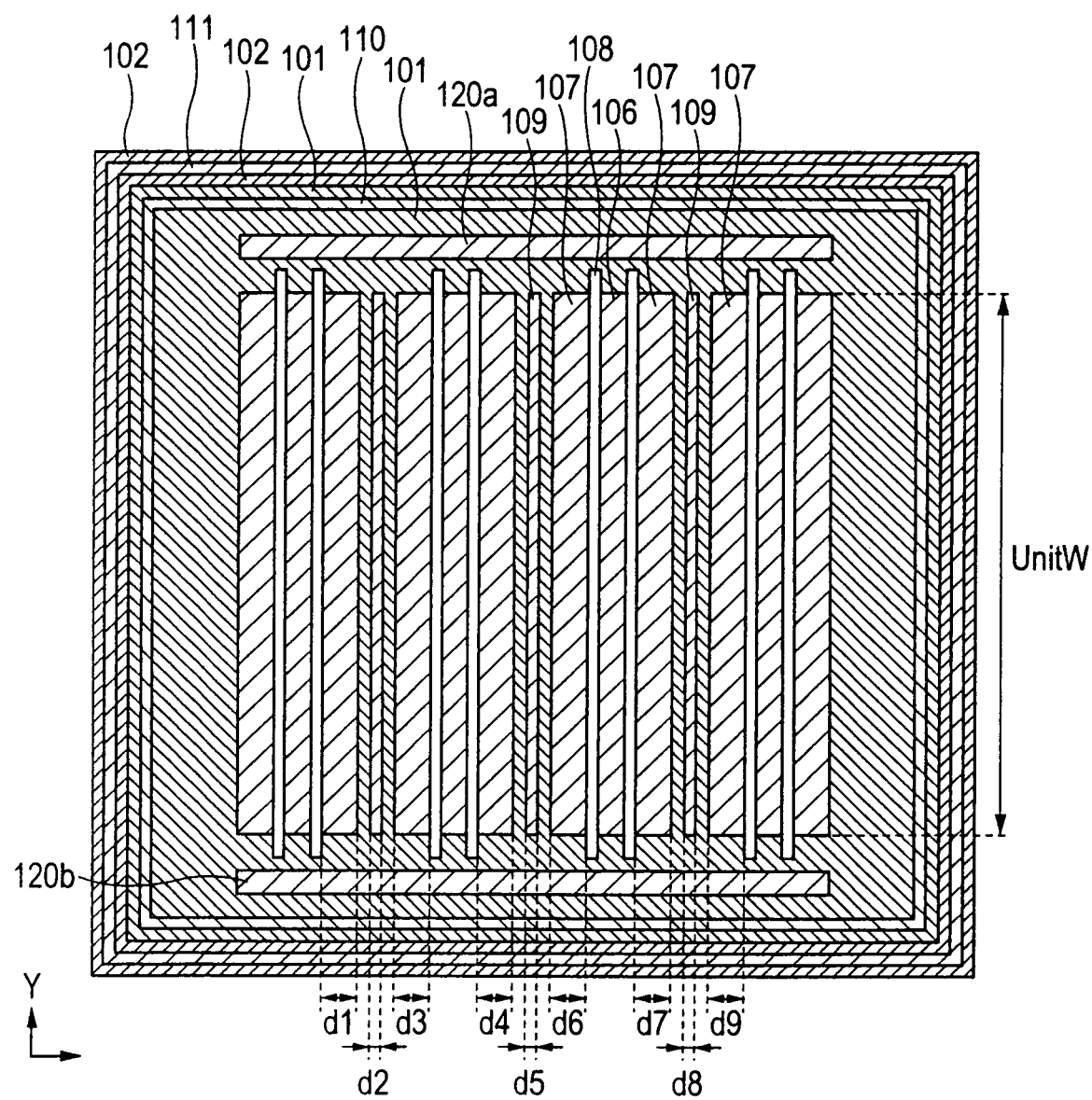
FIG. 21 is a plan view showing a semiconductor device according to a third embodiment.

FIG. 21 is a plan view of a semiconductor device of the third embodiment. In the third embodiment, the low concentration P-type substrate region 104 which is insulated by the element separation region provided in the second embodiment shown in FIG. 20 is not provided. Generally, in this case, since a gate processing dimension can be processed in more accurate and more microscopic dimension than the processing dimension of the element separation region 105, area increase in a direction intersecting to the gate at right angles (a direction where the electric current of the MOS transistor flows) can be reduced by separating the diffusion layer by the gate electrode without using the element separation region. When the protection element itself is driven as an output buffer, the driving capacity can be adjusted in a manner that shape of a transistor is formed as well as the diffusion layer is added.

In the above-described embodiments, protection of the N-channel open-drain signal terminal is described. However, it goes without saying that this protection can be applied to a P-channel open-drain signal terminal. In addition, transistors are described about embodiments of MOS transistors. However, a gate insulating film is not limited to an oxide film and the present invention can be applied to general MIS transistors.

Within the frame of the entire disclosure of the present invention (including claims), embodiments can further be modified and adjusted, based on its basic technological ideas. Within the frame of claims of the present invention, wide variety of combinations or selections of various disclosure elements are possible. In other words, it is understood that the present invention includes various modifications and adjustments which can be achieved by those skilled in the art according to the entire disclosure including claims and technological ideas.

What is claimed is:

1. A semiconductor device comprising:
a first and a second power source terminals;
an open-drain signal terminal; a first conduction-type well provided over a surface of a semiconductor substrate;
at least one second conduction-type MIS (Metal-insulator-Semiconductor) transistors in which a source region provided over a surface of the first conduction-type well is coupled to the second power source terminal and in which a drain region provided over the surface of the first conduction-type welt is coupled to the open-drain signal terminal;
a pair of second conduction-type first regions provided in parallel with a first direction where electric current of the at least one second conduction-type MIS transistors flows over the surface of the first conduction-type well, and located at both sides of the at least one second conduction-type MIS transistors along a second direction which intersects at right angles to the first direction and each of the second conduction-type first regions is coupled to the open-drain signal terminal;
a first conduction-type guard ring provided over the surface of the first conduction-type well and in an outer circumferential part of the first conduction-type well surrounding the at least one second conduction-type MIS transistors and the pair of second conduction-type first regions and coupled to the second power source terminal,
wherein the first conduction-type guard ring has higher concentration than that of the first conduction-type well;
a second first conduction-type guard ring provided over the surface of the semiconductor substrate further surrounding the first conduction-type guard ring from the outside and coupled to the first power source terminal; and
a protection element between the first power source terminal and the second power source terminal.

2. The semiconductor device according to claim 1,
wherein the at least one second conduction-type MIS transistors are located between the pair of second conduction-type first regions in the first direction, and each source region and each drain region of the at least one second conduction-type MIS transistors are coupled to the second power source terminal and the open-drain signal terminal, respectively,
wherein the at least one second conduction-type MIS transistors in which each source region provided over the surface of the first conduction-type well is coupled to the second power source terminal and in which each drain region provided over the surface of the first conduction-type well is coupled to the open-drain signal terminal, and
wherein each electric current of the at least one second conduction-type MIS transistors flows over the surface of the first conduction-type well in the first direction.

3. The semiconductor device according to claim 2,
wherein a planar shape of the pair of second conduction-type first regions is approximately a rectangular shape in which a side length in the first direction is longer than another side length in the second direction.

4. The semiconductor device according to claim 2, further comprising:
a low concentration first conduction-type region which has lower concentration than a concentration of the first conduction-type well is provided over the surface of the first conduction-type well between both ends of the at least one second conduction-type MIS transistors located in the first direction and the first conduction-type guard ring facing to the both ends.

5. The semiconductor device according to claim 2, wherein adjacent two of the at least one second conduction-type MIS transistors are located facing each other in the first direction with a common source region, and are located so that both ends of the adjacent two of the at least one second conduction-type MIS transistors located in the first direction act as the drain regions.

6. The semiconductor device according to claim 2, further comprising: a plurality of second conduction-type ballast resistance regions which are provided over the surface of the first conduction-type well, and
wherein each of the second-type ballast resistance regions which are provided between adjacent two drain regions of the at least one second conduction-type MIS transistors, is coupled to each of the adjacent two drain regions of the second conduction-type MIS transistors and through a wiring, and further coupled to the open-drain signal terminal and through another wiring.

7. The semiconductor device according to claim 6, wherein a length of each drain region of the at least one second conduction-type MIS transistors in the second direction is longer than a total length of the drain regions of the at least one second conduction-type MIS transistors provided over the surface of the first conduction-type well and the second conduction-type ballast resistance regions in the first direction.

8. The semiconductor device according to claim 2, wherein a planar shape of the pair of second conduction-type first regions includes a side length in the first direction that is longer than another side length in the second direction.

9. The semiconductor device according to claim 2, further comprising:
a plurality of second conduction-type ballast resistance regions provided over the surface of the first conduction-type well.

10. The semiconductor device according to claim 1, further comprising:
a second conduction-type well provided over the surface of the semiconductor substrate outside of the first conduction-type well surrounding the first conduction-type well, and the second first conduction-type guard ring provided over the surface of the second conduction-type well, and wherein the semiconductor substrate comprises a first conduction-type semiconductor substrate.

* * * * *